(12) United States Patent
Yoon et al.

(10) Patent No.: US 10,541,302 B2
(45) Date of Patent: Jan. 21, 2020

(54) INTEGRATED CIRCUIT DEVICE AND METHOD OF MANUFACTURING THE SAME

(71) Applicant: SAMSUNG ELECTRONICS CO., LTD., Suwon-si, Gyeonggi-Do (KR)

(72) Inventors: Chan-sic Yoon, Anyang-si (KR); Ho-in Lee, Suwon-si (KR); Ki-seok Lee, Hwaseong-si (KR); Je-min Park, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/881,863

(22) Filed: Jan. 29, 2018

(65) Prior Publication Data

US 2018/0350905 A1 Dec. 6, 2018

(30) Foreign Application Priority Data

May 31, 2017 (KR) .......................... 10-2017-0067634

(51) Int. Cl.
*H01L 21/762* (2006.01)
*H01L 29/06* (2006.01)
(Continued)

(52) U.S. Cl.
CPC .... *H01L 29/0649* (2013.01); *H01L 21/76232* (2013.01); *H01L 27/10894* (2013.01);
(Continued)

(58) Field of Classification Search
CPC ... H01L 21/762–765; H01L 21/823481; H01L 21/823431; H01L 21/823878;
(Continued)

(56) References Cited

U.S. PATENT DOCUMENTS 3,966,514 A * 6/1976 Feng ........................ H01L 21/32
438/425
4,667,395 A * 5/1987 Ahlgren ................ H01L 21/033
438/514

(Continued)

FOREIGN PATENT DOCUMENTS

JP 4322453 9/2009
KR 1020110112131 10/2011
(Continued)

*Primary Examiner* — Eric A. Ward
(74) *Attorney, Agent, or Firm* — F. Chau & Associates, LLC

(57) ABSTRACT

An integrated circuit device includes a substrate having a first region and a second region separated from each other along a direction parallel to an upper surface of the substrate. An interface device isolation layer fills an interface trench in an interface region between the first region and the second region and defines a portion of a first active area positioned in the first region and a portion of a second active area positioned in the second region. An insulation pattern extends from the first region to an upper portion of the interface device isolation layer. The insulation pattern covers the first active area and at least a portion of the interface device isolation layer. The insulation pattern defines an undercut area on an upper surface of the interface device isolation layer. A buried pattern substantially fills the undercut region.

22 Claims, 31 Drawing Sheets

(51) Int. Cl.
  *H01L 27/108* (2006.01)
  *G11C 11/408* (2006.01)
(52) U.S. Cl.
  CPC .... *H01L 27/10897* (2013.01); *G11C 11/4085* (2013.01); *H01L 27/10814* (2013.01)
(58) Field of Classification Search
  CPC ... H01L 27/108–10897; H01L 29/0649; H01L 29/0653; H01L 29/66681–66704; H01L 29/7816–7826
  See application file for complete search history.

(56) References Cited

U.S. PATENT DOCUMENTS

| | | | |
|---|---|---|---|
| 4,927,780 A * | 5/1990 | Roth | H01L 21/32 |
| | | | 257/506 |
| 5,455,194 A * | 10/1995 | Vasquez | H01L 21/76227 |
| | | | 148/DIG. 50 |
| 5,696,022 A * | 12/1997 | Jang | H01L 21/32 |
| | | | 257/E21.258 |
| 6,316,314 B1 * | 11/2001 | Ishige | H01L 27/105 |
| | | | 257/E21.687 |
| 6,835,981 B2 | 12/2004 | Yamada et al. | |
| 7,556,999 B2 | 7/2009 | Shih et al. | |
| 7,820,509 B2 * | 10/2010 | Ogawa | H01L 27/105 |
| | | | 257/365 |
| 7,932,143 B1 * | 4/2011 | Pal | H01L 21/28123 |
| | | | 257/E21.616 |
| 8,461,687 B2 | 8/2013 | Cho et al. | |
| 8,993,391 B2 | 3/2015 | Sung | |
| 9,196,619 B2 | 11/2015 | Wu | |
| 10,325,802 B2 * | 6/2019 | Lee | H01L 29/0649 |
| 2008/0303078 A1 * | 12/2008 | Takahashi | H01L 27/11565 |
| | | | 257/316 |
| 2011/0241102 A1 | 10/2011 | Cho et al. | |
| 2012/0153401 A1 * | 6/2012 | Javorka | H01L 21/823412 |
| | | | 257/392 |
| 2014/0264517 A1 | 9/2014 | Kim et al. | |
| 2015/0179658 A1 * | 6/2015 | Lee | H01L 21/28008 |
| | | | 257/386 |
| 2015/0303201 A1 | 10/2015 | Lee et al. | |
| 2018/0190586 A1 * | 7/2018 | Chang | H01L 21/31111 |

FOREIGN PATENT DOCUMENTS

| | | |
|---|---|---|
| KR | 1020140084913 | 7/2014 |
| KR | 1020140114517 | 9/2014 |
| KR | 1020150121767 | 10/2015 |

* cited by examiner

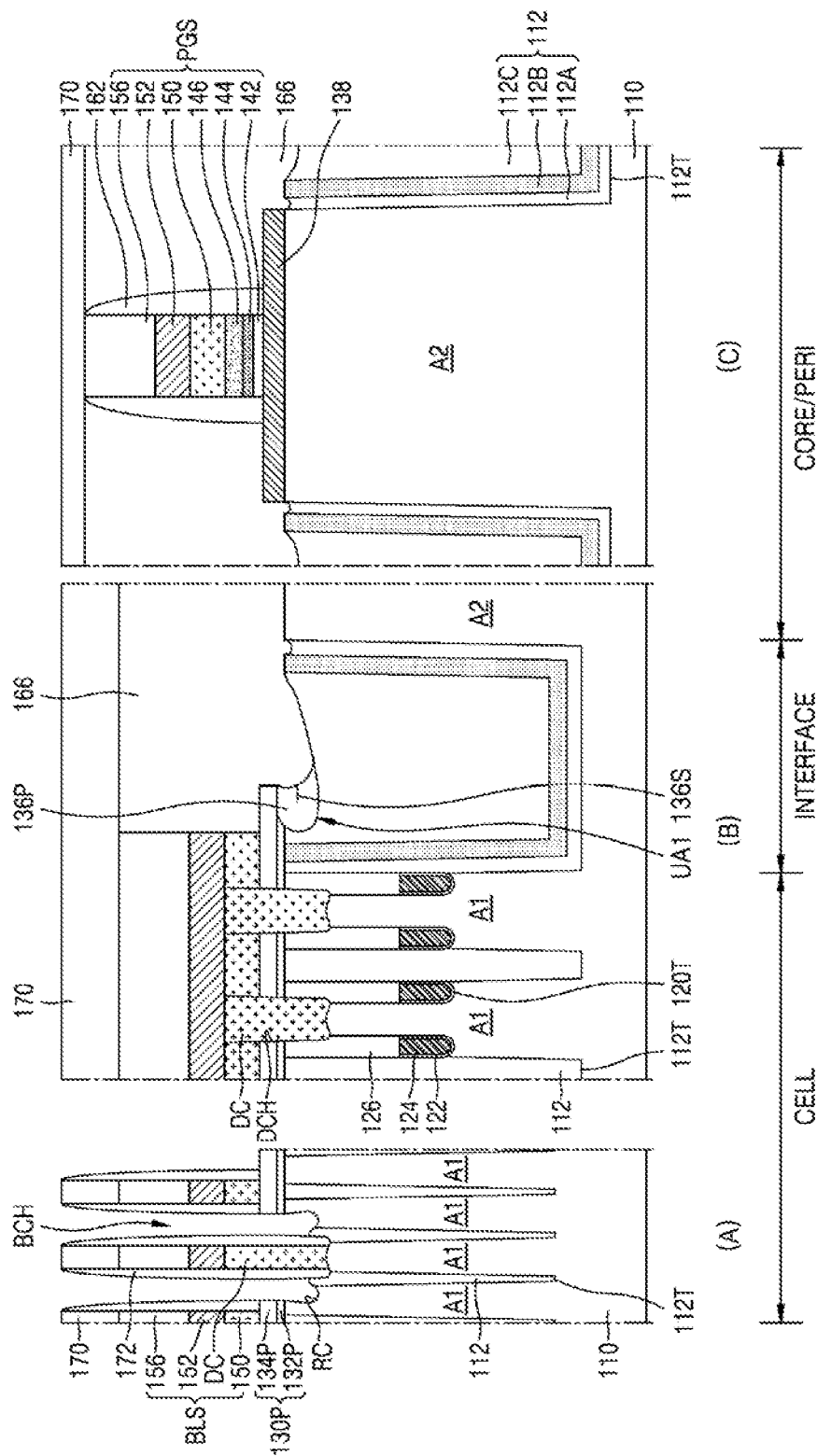

INTEGRATED CIRCUIT DEVICE AND METHOD OF MANUFACTURING THE SAME

CROSS-REFERENCE TO RELATED APPLICATION

This application claims priority under 35 U.S.C. § 119 to Korean Patent Application No. 10-2017-0067634, filed on May 31, 2017, in the Korean Intellectual Property Office, the disclosure of which is incorporated by reference herein in its entirety.

TECHNICAL FIELD

Exemplary embodiments of the present inventive concept relate to an integrated circuit device, and more particularly to a method of manufacturing the same.

DISCUSSION OF RELATED ART

With the development of electronic technology, downscaling of integrated circuit devices has rapidly progressed, and integrated circuit devices are becoming more compact. Contamination by impurities such as metal particles during a manufacturing process of a compact integrated circuit device may reduce performance and yield of such integrated circuit devices.

SUMMARY

An exemplary embodiment of the present inventive concept provides an integrated circuit device in which contamination by impurities such as metal particles may be reduced or eliminated, thus increasing electric performance and reliability of the integrated circuit device.

An exemplary embodiment of the present inventive concept provides a method of manufacturing an integrated circuit device, in which, even when process tolerance is not sufficient due to the increased minuteness of patterns that are to be formed, contamination sources, for example, impurities such as metal particles, are reduced or eliminated, thus reducing or eliminating adverse effects by the impurities and increasing the yield and reliability of the integrated circuit device.

According to an exemplary embodiment of the present inventive concept, an integrated circuit device includes a substrate having a first region and a second region separated from each other along a direction parallel to an upper surface of the substrate. An interface device isolation layer fills an interface trench in an interface region between the first region and the second region and defines a portion of a first active area positioned in the first region and a portion of a second active area positioned in the second region. An insulation pattern extends from the first region to an upper portion of the interface device isolation layer. The insulation pattern covers the first active area and at least a portion of the interface device isolation layer. The insulation pattern defines an undercut area on an upper surface of the interface device isolation layer. A buried pattern substantially fills the undercut region.

According to an exemplary embodiment of the present inventive concept, an integrated circuit device includes a substrate comprising a cell array region including a cell active region and a peripheral circuit region including a peripheral circuit active region separated from each other along a direction parallel to an upper surface of the substrate. A first device isolation layer fills an interface trench extending in an interface region between the cell array region and the peripheral circuit region and defines a portion of the cell active region and a portion of the peripheral circuit active region. An insulation pattern extends from the cell array region to an upper portion of the first device isolation layer. The insulation pattern covers an upper surface of the cell active region and at least a portion of the first device isolation layer. The insulation pattern defines an undercut area on an upper surface of the first device isolation layer. A buried pattern substantially fills the undercut region.

According to an exemplary embodiment of the present inventive concept, a method of manufacturing an integrated circuit includes providing a substrate having a cell array region including a cell active region, a peripheral circuit region including a peripheral circuit active region separated from cell array region along a direction parallel to an upper surface of the substrate, and an interface region including a device isolation layer defining a portion of the cell active region and a portion of the peripheral circuit active region and positioned between the cell array region and the peripheral circuit region. The method includes forming an insulation pattern extending from the cell array region to an upper portion of the device isolation layer so as to cover an upper surface of the cell active region and at least a portion of the device isolation layer. The method includes forming an undercut area under the insulation pattern by removing a portion of the device isolation layer in the interface region. The method includes forming a buried pattern substantially filling the undercut area. The method includes forming an insulating layer covering the insulation pattern, the buried pattern, and the device isolation layer in the interface region.

The integrated circuit device according to an exemplary embodiment of the present inventive concept may have a structure in which the undercut region formed in the interface region is filled by a buried pattern so a metal contamination source may be prevented from remaining in the interface region. Thus, while dense and fine structures such as a plurality of bit line structures are formed in the cell array region, contamination of the minute structures by a metal contamination source may be reduced or eliminated, and degradation of electrical characteristics and reliability of the integrated circuit device to be manufactured may be prevented.

According to the method of manufacturing an integrated circuit device according to an exemplary embodiment of the present inventive concept, even when process tolerance is not sufficient due to the increased minuteness of patterns that are to be formed, contamination sources, for example, impurities such as metal particles, may be reduced or eliminated, thus preventing adverse effects due to the impurities during subsequent processes of forming minute patterns, and increasing the yield and reliability of the integrated circuit device.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Figure 1:
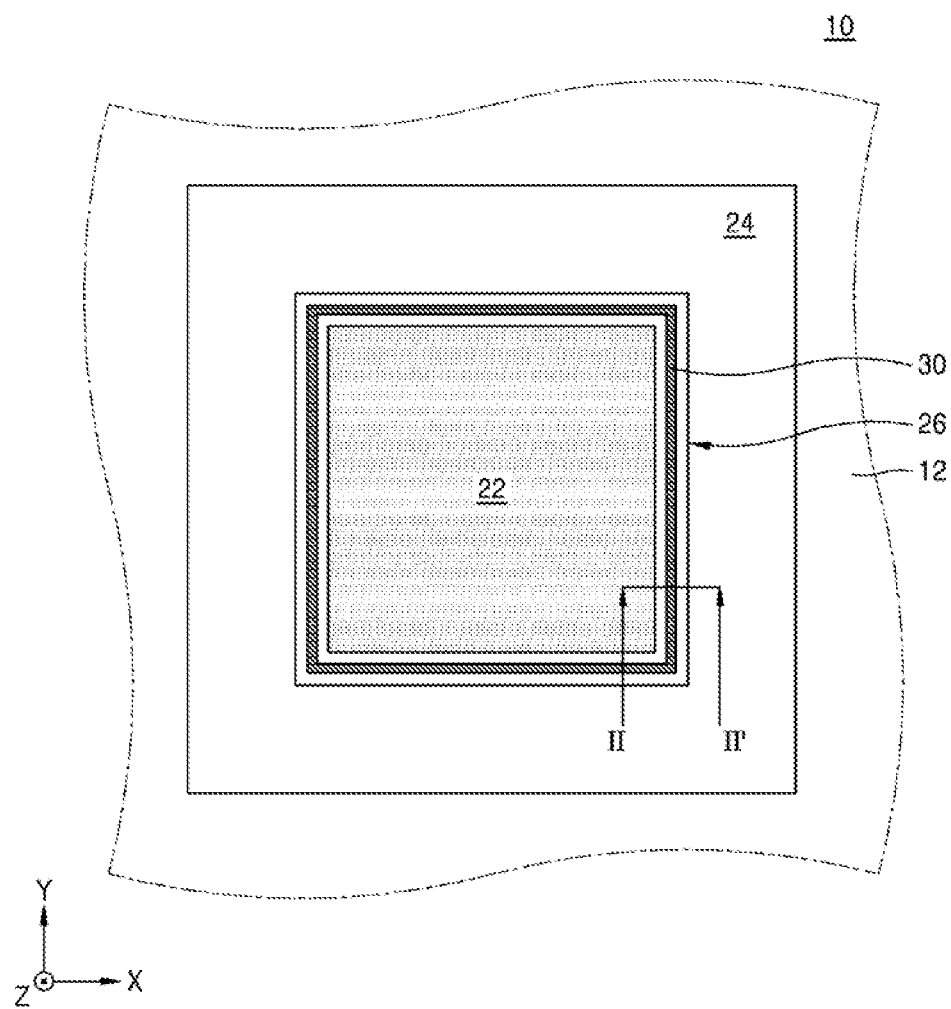
FIG. 1 is a plan view illustrating a schematic structure of an integrated circuit device according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

FIG. 1 is a plan view illustrating a schematic structure of an integrated circuit device according to an exemplary embodiment of the present inventive concept.

Referring to FIG. 1, an integrated circuit device 10 may include a substrate 12 including a first region 22, a second region 24 surrounding the first region 22, and an interface region 26 positioned between the first region 22 and the second region 24 along a direction parallel to an upper surface of the substrate 12.

The substrate 12 may include a semiconductor element such as Si or Ge or at least one compound semiconductor selected from SiGe, SiC, GaAs, InAs, or InP. The substrate 12 may include a conductive region such as an impurity-doped well or an impurity-doped structure.

In an exemplary embodiment of the present inventive concept, the first region 22 may be a memory cell region of the integrated circuit device 10. The first region 22 may form a memory cell region of a volatile memory device or a memory cell region of a nonvolatile memory device. The memory cell region may be a memory cell region of a dynamic random-access memory (DRAM), a memory cell region of a magnetic RAM (MRAM), a memory cell region of a static RAM (SRAM), a memory cell region of a phase-change RAM (PRAM), or a memory cell region of a ferroelectric RAM (FRAM). The first region 22 may include any one type of memory cell selected from a DRAM memory cell, an MRAM memory cell, an SRAM memory cell, a PRAM memory cell, an RRAM memory cell, or a FRAM memory cell. The first region 22 may include a unit memory cell having a transistor and a capacitor, or a unit memory cell having a switching element and a variable resistor.

The second region 24 may be a core region or a peripheral circuit region (which may be referred to herein as a "peripheral circuit region"). Peripheral circuits driving memory cells in the first region 22 may be positioned in the second region 24.

A plurality of conductive lines positioned to provide electrical connection between the first region 22 and the second region 24, and insulating structures insulating between the first region 22 and the second region 24, may be positioned in the interface region 26.

In the interface region 26, a buried pattern 30 may be formed to prevent unwanted residue from being deposited or remaining in the interface region 26. The buried pattern 30 may have a planar shape surrounding the first region 22 (e.g., when viewed in a plan view). For example, the buried pattern 30 may have a closed loop shape surrounding the first region 22 along an X-Y plane. The buried pattern 30 may include at least one type of insulating material, or a combination of at least one type of insulating material and an air gap.

Figure 2A:
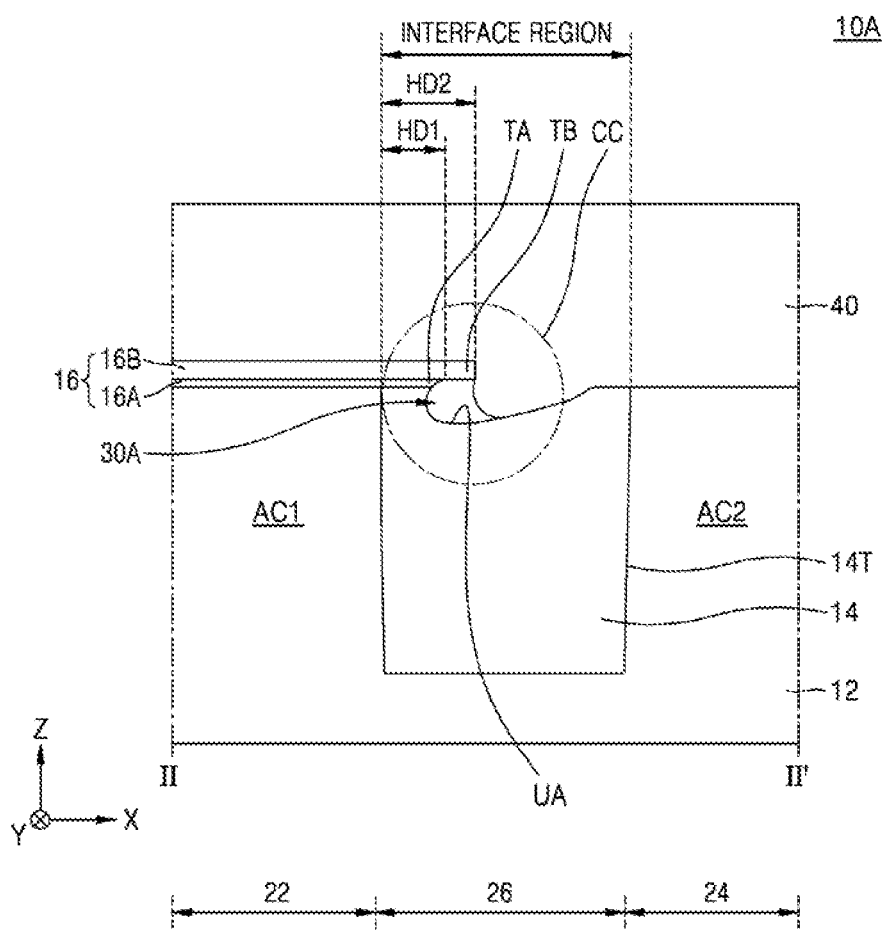
FIG. 2A is a cross-sectional view of a schematic structure of an integrated circuit device according to an exemplary embodiment of the present inventive concept.

FIG. 2A is a cross-sectional view of a schematic structure of an integrated circuit device according to an exemplary embodiment of the present inventive concept. The structure illustrated in FIG. 2A is an example cross-section of a partial region of the integrated circuit device 10 illustrated in FIG. 1, and may correspond to a cross-section cut along line II-II' of FIG. 1.

Referring to FIG. 2A, an interface trench 14T extending along the interface region 26 between the first region 22 and the second region 24 may be formed in the substrate 12 of an integrated circuit device 10A. The interface trench 14T may be filled with an interface device isolation layer 14. The interface device isolation layer 14 may include a silicon oxide layer, a silicon nitride layer, or a combination thereof.

The interface device isolation layer 14 may define a portion of a first active area AC1 positioned in the first region 22 and a portion of a second active area AC2 positioned in the second region 24. The interface device isolation layer 14 may have a planar shape corresponding to a planar shape of the interface region 26 illustrated in FIG. 1, so as to surround the first region 22 (e.g., in a plan view).

An insulation pattern 16 covering the first region 22 and the interface region 26 and extending in parallel to a main surface of the substrate 12 (X-Y plane) may be formed on the substrate 12. The insulation pattern 16 may include a first insulation pattern 16A and a second insulation pattern 16B sequentially stacked on the substrate 12. The first insulation pattern 16A and the second insulation pattern 16B may include different insulating materials from each other. For example, the first insulation pattern 16A and the second insulation pattern 16B may include different layers selected from an oxide layer and a nitride layer.

The first insulation pattern 16A may extend to cover a portion of the first active area AC1 and a portion of the interface device isolation layer 14. The first insulation pattern 16A may extend in the interface region 26 from the first region 22 toward the second region 24 to a first location that is a first horizontal distance HD1 from the first region 22.

The second insulation pattern 16B may extend, with the first insulation pattern 16A between the second insulation pattern 16B and the first active region AC1, to cover a portion of the first active area AC1 and a portion of the interface device isolation layer 14. The second insulation pattern 16B may extend in the interface region 26 from the first region 22 toward the second region 24, to a second location at a second horizontal distance HD2 from the first region 22 that is greater than the first horizontal distance HD1. The second location may be closer to the second region 24 than the first location is to the second region 24 along the direction parallel to the upper surface of the substrate 12. Thus, a terminal portion TB of the second insulation pattern 16B may be closer to the second region 24 than a terminal portion TA of the first insulation pattern 16A is to the second region 24 along the direction parallel to the upper surface of the substrate 12.

In an exemplary embodiment of the present inventive concept, the first insulation pattern 16A may be omitted, and the insulation pattern 16 may include only the second insulation pattern 16B. In an exemplary embodiment of the present inventive concept, the insulation pattern 16 may include a multi-layer including at least three insulation patterns including the first insulation pattern 16A and the second insulation pattern 16B.

In the interface region 26, an undercut area UA may be formed under the terminal portion TB of the second insulation pattern 16B. The undercut area UA may be substantially filled with a buried pattern 30A. A height of the buried pattern 30A along a direction orthogonal to an upper surface of the substrate 12 may be defined by the interface device isolation layer 14 and the second insulation pattern 16B. The buried pattern 30A may include at least a portion of the buried pattern 30 described with reference to FIG. 1.

As described above with respect to the buried pattern 30 with reference to FIG. 1, the buried pattern 30A may have a closed loop shape surrounding the first region 22 on the interface device isolation layer 14 along the X-Y plane. The buried pattern 30A may include an insulating layer without a metal. For example, the buried pattern 30A may include a silicon oxide, a silicon nitride, a silicon oxynitride (SiON), a silicon oxycarbonitride (SiOCN), polysilicon, or a combination thereof. The buried pattern 30A may include a same material as one of the first insulation pattern 16A and the second insulation pattern 16B.

The first active area AC1, the second active area AC2, the interface device isolation layer 14, the buried pattern 30A, and the insulation pattern 16 may be covered by an insulating layer 40. The insulating layer 40 may include an oxide layer, a nitride layer, or a combination thereof.

Figure 2B:
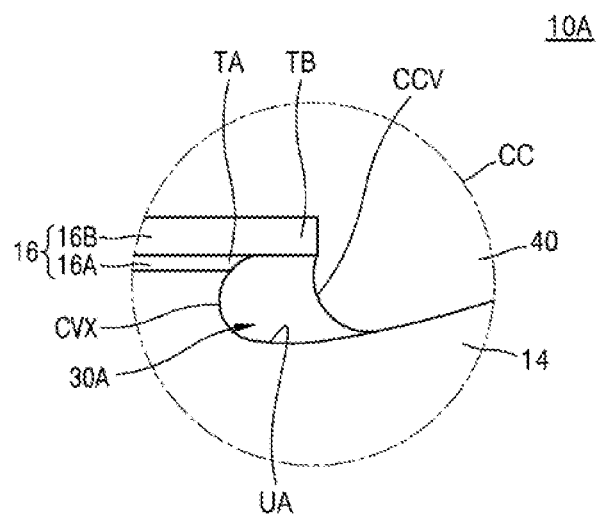
FIG. 2B is an expanded cross-sectional view of a portion denoted as "CC" in FIG. 2A.

FIG. 2B is an expanded cross-sectional view of a portion denoted as "CC" in FIG. 2A.

Referring to FIGS. 2A and 2B, the buried pattern 30A may include a convex surface CVX protruding toward the first region 22 and a concave surface CCV recessed toward a center of the buried pattern 30A along the direction parallel to the upper surface of the substrate 12. The concave surface CCV may face the second region 24. In the interface region 26, the convex surface CVX of the buried pattern 30A may be in direct contact with the terminal portion TA of the first insulation pattern 16A. In the interface region 26, due to the convex surface CVX of the buried pattern 30A, an interface between the interface device isolation layer 14 and the buried pattern 30A may be a curved surface.

FIGS. 3 through 7 are each cross-sectional views illustrating structures of an integrated circuit device according to an exemplary embodiment of the present inventive concept. Integrated circuit devices 10B, 10C, 10D, 10E, and 10F illustrated in FIGS. 3 through 7 are modified examples of the integrated circuit device 10A illustrated in FIGS. 2A and 2B, and include modified structures of an area corresponding to the region denoted by "CC" of FIG. 2A.

Figure 3:
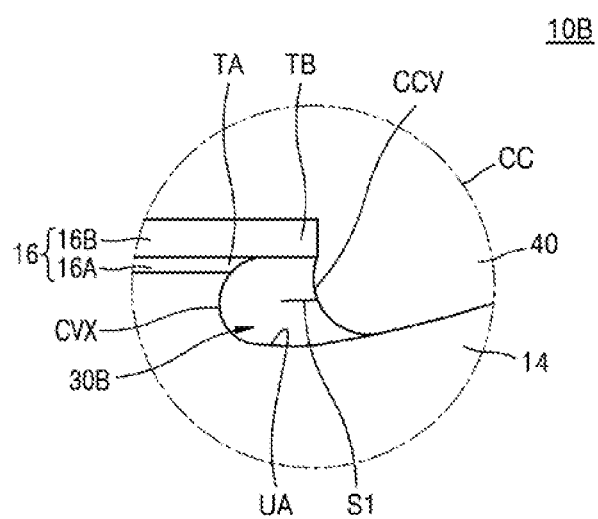
FIGS. 3 through 7 are each cross-sectional views illustrating structures of an integrated circuit device according to an exemplary embodiment of the present inventive concept.

Referring to FIG. 3, the integrated circuit device 10B has substantially the same structure as the integrated circuit device 10A illustrated in FIGS. 2A and 2B. For example, a buried pattern 30B of the integrated circuit device 10B has substantially the same structure as the buried pattern 30A illustrated in FIGS. 2A and 2B. However, the buried pattern 30B includes a seam line S1 extending from the concave surface CCV facing the second region 24, toward an inner portion of the buried pattern 30B. The seam line S1 may be formed during a deposition process in which the buried pattern 30B is formed.

Figure 4:
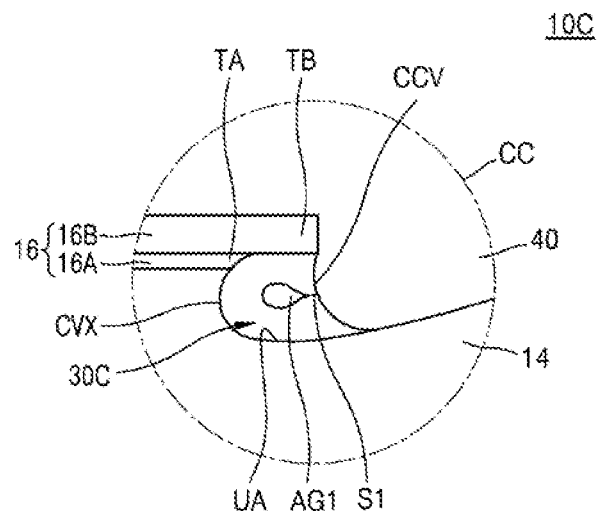

Referring to FIG. 4, the integrated circuit device 10C has substantially the same structure as the integrated circuit device 10A illustrated in FIGS. 2A and 2B. For example, a buried pattern 30C of the integrated circuit device 10C has substantially the same structure as the buried pattern 30A illustrated in FIGS. 2A and 2B. However, the buried pattern 30C includes a scam line S1 that extends from the concave surface CCV facing the second region 24, toward an inner portion of the buried pattern 30C, and an air gap AG1 formed at an end of the seam line S1. The seam line S1 and the air gap AG1 may be formed during a deposition process in which the buried pattern 30C is formed. The buried pattern 30C may be at least a portion of the buried pattern 30 illustrated in FIG. 1.

Figure 5:
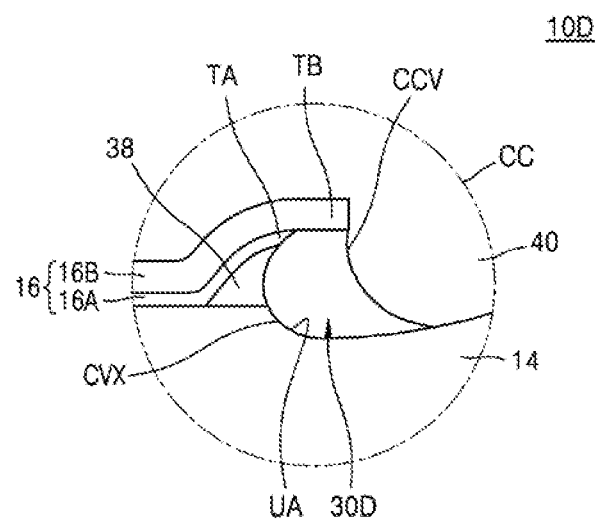

Referring to FIG. 5, the integrated circuit device 10D has substantially the same structure as the integrated circuit device 10A illustrated in FIGS. 2A and 2B. For example, a buried pattern 30D of the integrated circuit device 10D has substantially the same structure as the buried pattern 30A illustrated in FIGS. 2A and 2B. However, the integrated circuit device 10D includes a local insulation pattern 38 positioned in the interface region 26 and surrounded by the interface device isolation layer 14, the insulation pattern 16, and the buried pattern 30D. The local insulation pattern 38 may define a portion of the undercut area UA. The local insulation pattern 38 may be in direct contact with the convex surface CVX of the buried pattern 30D. The local insulation pattern 38 may include a silicon oxide layer, a silicon nitride layer, or a combination thereof. The buried pattern 30D may include at least a portion of the buried pattern 30 described with reference to FIG. 1.

The first insulation pattern 16A and the second insulation pattern 16B may have a cross-sectional shape that is curved at a location adjacent to the local insulation pattern 38. Portions of the first insulation pattern 16A and the second insulation pattern 16B that are in the first region 22 with respect to a point where the local insulation pattern 38 is positioned may extend in parallel to a main surface (X-Y plane) of the substrate 12 (see, e.g., FIG. 2A), and portions of the first insulation pattern 16A and the second insulation pattern 16B on the local insulation pattern 38 may protrude upwards away from the interface device isolation layer 14 in a direction away from the first region 22 along the direction orthogonal to the upper surface of the substrate 12 so as to have a curved cross-sectional shape at the location adjacent to the local insulation pattern 38. The terminal portions TA and TB of the first and second insulation patterns 16A and 16B in the interface region 26 may be at a higher level than portions of the first insulation pattern 16A and the second insulation pattern 16B that are in the first region 22. The term "level" used in the present specification refers to a height or a depth in a vertical direction with respect to the main surface of the substrate 12 (see FIG. 2A) along the direction orthogonal to the upper surface of the substrate 12. Thus, locations at the same level indicate those that are at a same height in a vertical upward direction from the main surface of the substrate 12 or those at a same depth into an inner portion of the substrate 12 from the main surface thereof. Locations at a lower level indicate those at a lower height in a vertical upward direction from the main surface of the substrate 12 or those at a deeper depth into the inner portion of the substrate 12 from the main surface thereof. Locations at a higher level indicate those at a higher height in a vertical upward direction from the main surface of the substrate 12 and those at a smaller depth into the inner portion of the substrate 12 from the main surface thereof.

Figure 6:
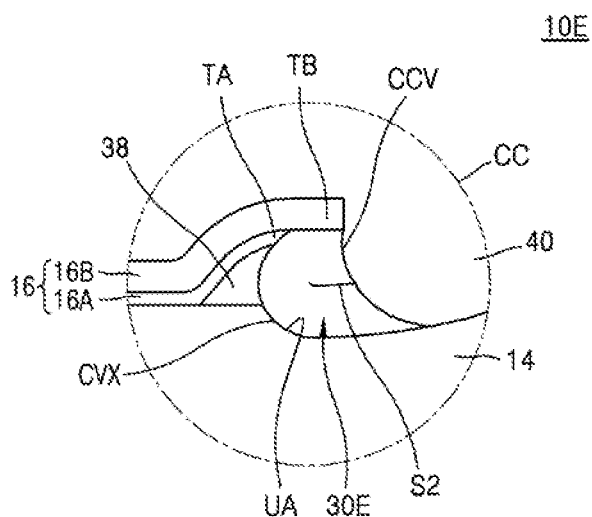

Referring to FIG. 6, the integrated circuit device 10E has substantially the same structure as the integrated circuit device 10D described with reference to FIG. 5. For example, a buried pattern 30E of the integrated circuit device 10E has substantially the same structure as the buried pattern 30D illustrated in FIG. 5. However, the buried pattern 30E includes a seam line S2 extending from the concave surface CCV facing the second region 24, toward an inner portion of the buried pattern 30E. The seam line S2 may be formed during a deposition process in which the buried pattern 30E is formed. The buried pattern 30E may include at least a portion of the buried pattern 30 described with reference to FIG. 1.

Figure 7:
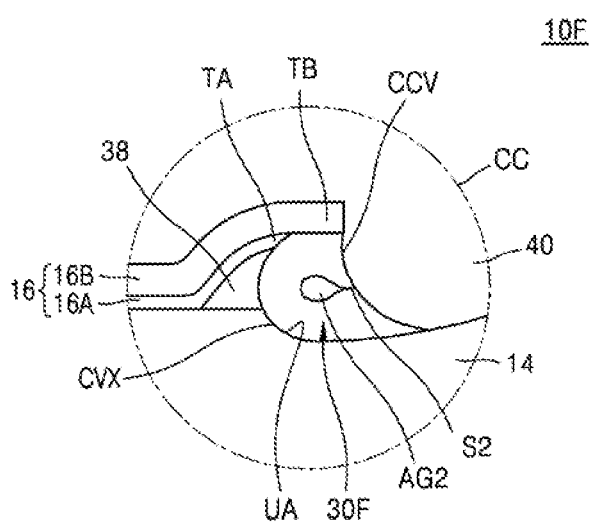

Referring to FIG. 7, the integrated circuit device 10F has substantially the same structure as the integrated circuit device 10D illustrated in FIG. 5. For example, a buried pattern 30F of the integrated circuit device 10F has substantially the same structure as the buried pattern 30D illustrated in FIG. 5. However, the buried pattern 30F includes a seam line S2 extending from the concave surface CCV facing the second region 24, toward an inner portion of the buried pattern 30F, and an air gap AG2 formed at an end of the seam line S2. The seam line S2 and the air gap AG2 may be formed during a deposition process in which the buried pattern 30F is formed. The buried pattern 30F may include at least a portion of the buried pattern 30 described with reference to FIG. 1.

Referring to FIG. 1, in an exemplary embodiment of the present inventive concept, the integrated circuit device 10 may be a DRAM device, and the first region 22 may be a memory cell region of the DRAM device.

Figure 8:
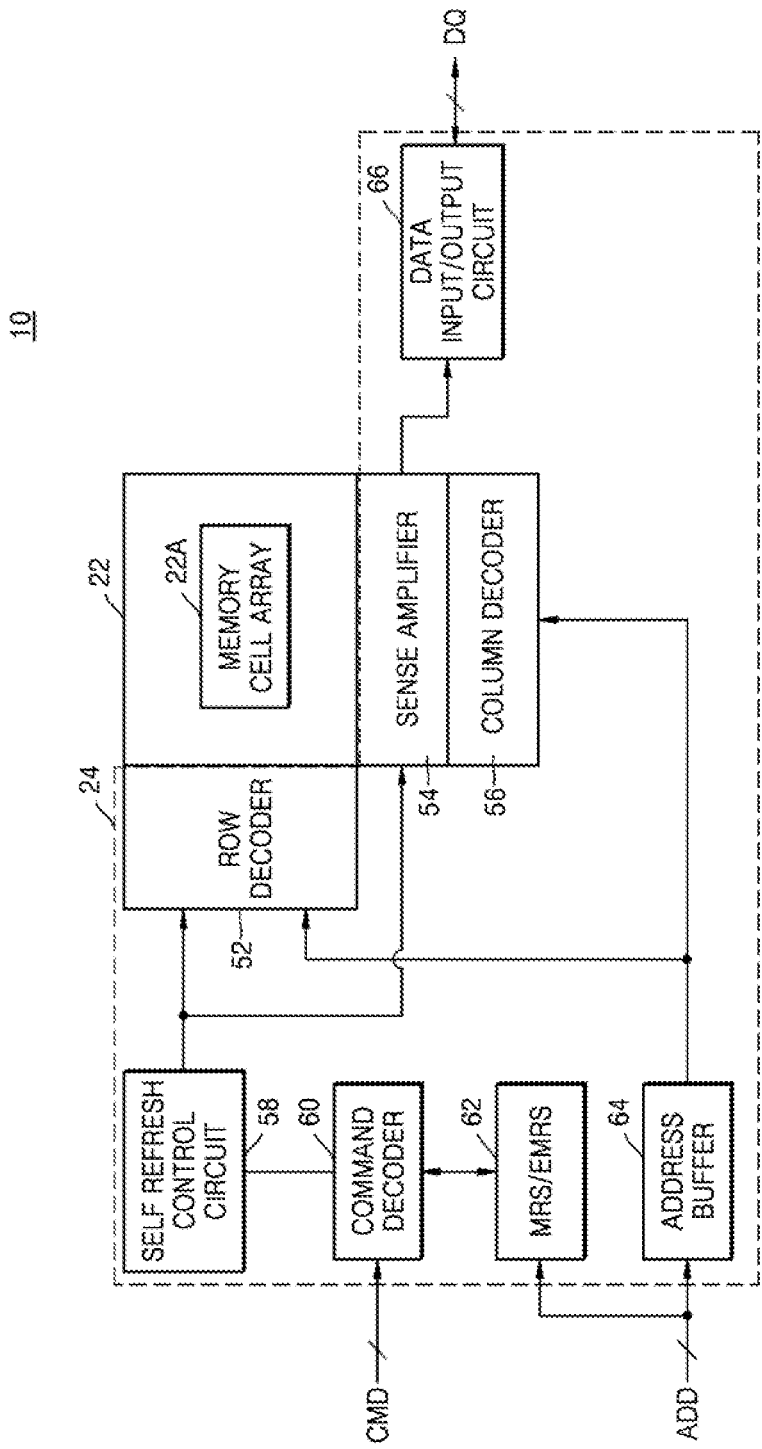
FIG. 8 is a structural block diagram of an integrated circuit device according to an exemplary embodiment of the present inventive concept.

FIG. 8 is a structural block diagram of an integrated circuit device according to an exemplary embodiment of the present inventive concept.

Referring to FIG. 8, in the integrated circuit device 10, the first region 22 may be a memory cell region of the DRAM device, and the second region 24 may be a peripheral circuit region of the DRAM device. The first region 22 may include a memory cell array 22A. A plurality of memory cells for storing data in the memory cell array 22A may be arranged in a row direction and a column direction. The plurality of memory cells may each include a cell capacitor and an access transistor. A gate of the access transistor may be connected to a corresponding word line from among a plurality of word lines arranged in the row direction, and one of a source and a drain of the access transistor may be connected to a bit line or a complementary bit line arranged in the column direction, and the other of the source and the drain may be connected to the cell capacitor.

The second region 24 may include a row decoder 52, a sense amplifier 54, a column decoder 56, a self-refresh control circuit 58, a command decoder 60, a Mode Register Set/Extended Mode Register Set (MRS/EMRS) circuit 62, an address buffer 64, and a data input/output circuit 66.

The sense amplifier 54 may sense and amplify data of a memory cell and store the data in the memory cell. The sense amplifier 54 may be implemented as a cross-coupled amplifier connected between a bit line and a complementary bit line included in the memory cell array 22A.

Data DQ input through the data input/output circuit 66 may be written to the memory cell array 22A based on an address signal ADD, and the data DQ read from the memory cell array 22A based on the address signal ADD may be output to the outside through the data input/output circuit 66. An address signal ADD may be input to the address buffer 64 so that a memory cell to or from which data is to be written or read may be designated. The address buffer 64 may temporarily store an address signal ADD that is input from an external source.

The row decoder 52 may decode a row address from among address signals ADD output from the address buffer 64, in order to designate a word line connected to a memory cell to or from which data is to be input or output. For example, in a data write mode or a data read mode, the row decoder 52 may decode a row address output from the address buffer 64 and enable a corresponding word line. In a self-refresh mode, the row decoder 52 may decode a row address generated front an address counter and enable a corresponding word line.

The column decoder 56 may decode a column address from among address signals ADD output from the address buffer 64, and thus may designate a bit line connected to the memory cell to or from which data is to be input or output. Data may be output from or written to a memory cell designated by row and column addresses or via the memory cell array 22A.

The command decoder 60 may receive a command signal CMD applied from an external source, and may decode the signal to internally generate a decoded command signal such as a self-refresh entry command or a self-refresh exit command.

The MRS/EMRS circuit 62 may set an internal mode register in response to an MRS/EMRS command and an address signal ADD to designate an operation mode of the integrated circuit device 10.

The integrated circuit device 10 may include a clock circuit that generates a clock signal or a power circuit that receives a power voltage applied from an external source and generates or distributes the internal voltage, or the like.

The self-refresh control circuit 58 may control a self-refresh operation of the integrated circuit device 10 in response to a command output from the command decoder 60. The command decoder 60 may include an address counter, a timer, and a core voltage generator. In response to the self-refresh entry command output from the command decoder 60, the address counter may generate a row address for designating a row address to self-refresh, and apply the row address to the row decoder 52. The address counter may stop a counting operation in response to a self-refresh exit command output from the command decoder 60.

Figure 9:
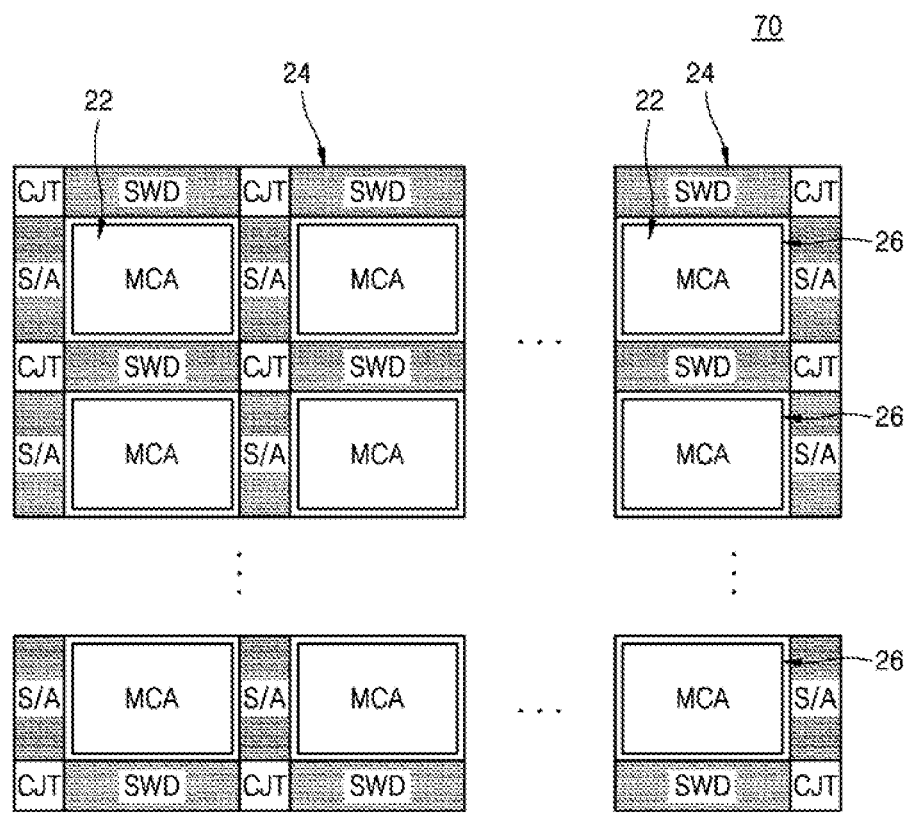
FIG. 9 is a plan view of a schematic structure of an integrated circuit device according to an exemplary embodiment of the present inventive concept.

FIG. 9 is a plan view of a schematic structure of an integrated circuit device according to an exemplary embodiment of the present inventive concept.

Referring to FIG. 9, an integrated circuit device 70 may include a plurality of first regions 22. The plurality of first regions 22 may each be surrounded by the second region 24 (e.g., when viewed in a plan view), with the interface region 26 therebetween. In the integrated circuit device 70, the plurality of first regions 22 may each be a memory cell array region MCA of a DRAM device, and the second region 24 may be a peripheral circuit region of the DRAM device.

The memory cell array region MCA in the plurality of first regions 22 may include the memory cell array 22A described with reference to FIG. 8. The plurality of first regions 22 may be each surrounded by the interface region 26 (e.g., when viewed in a plan view). The buried pattern 30 described with reference to FIG. 1 may be formed in the interface region 26. The buried pattern 30 may have a cross-section of at least one of the buried patterns 30A, 30B, 30C, 30D, 30E, and 30F described with reference to FIGS. 2A through 7.

The second region 24 may include a sub-word line driver block SWD, a sense amplifier block S/A, and a conjunction block CJT. In the second region 24, a plurality of sub-word line driver blocks SWD may be arranged in a word line direction of the memory cell array region MCA, and a plurality of sense amplifier blocks S/A may be arranged in a bit line direction. A plurality of bit line sense amplifiers may be arranged in the sense amplifier blocks S/A. The conjunction block CJT may be arranged at a position where the sub-word line driver blocks SWD and the sense amplifier blocks S/A intersect with each other. In the conjunction block CJT, power drivers and ground drivers for driving the bit line sense amplifiers may be alternately arranged.

A peripheral circuit such as an inverter chain, or an input/output circuit may be further formed in the second region 24.

Figure 10:
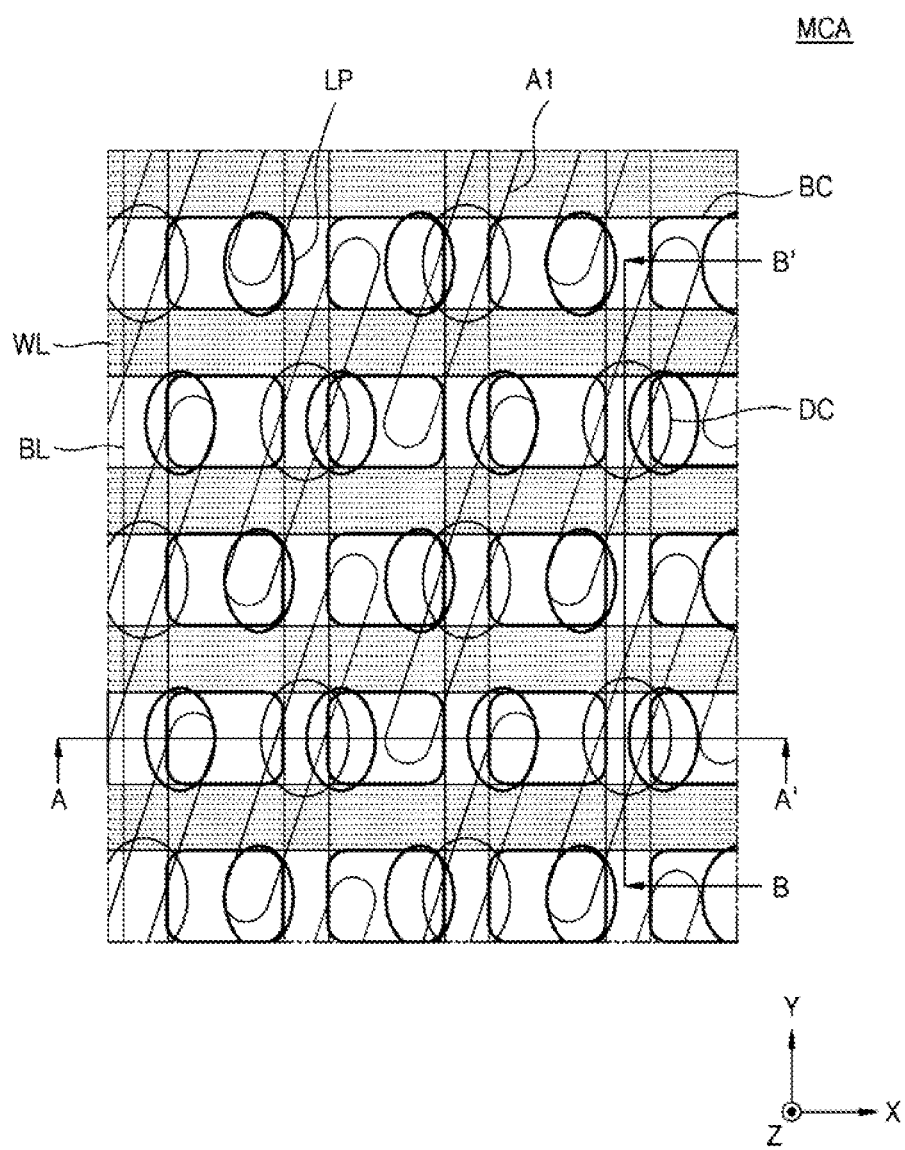
FIG. 10 is a schematic plan layout illustrating structures of a memory cell array region of an integrated circuit device according to an exemplary embodiment of the present inventive concept.

FIG. 10 is a schematic plan layout illustrating structures of a memory cell array region of an integrated circuit device according to an exemplary embodiment of the present inventive concept.

Referring to FIG. 10, the memory cell array region MCA may include a plurality of cell active regions A1. The plurality of cell active regions A1 may be arranged to have a long axis in a diagonal direction with respect to a first direction (X direction) and a second direction (Y direction).

A plurality of word lines WL may extend in parallel to each other across the plurality of cell active regions A1 and in the first direction (X direction). A plurality of bit lines BL may extend in parallel to each other above the plurality of word lines WL in the second direction (Y direction) crossing the first direction (X direction). The plurality of bit lines BL may be connected to the plurality of cell active regions A1 via direct contacts DC.

A plurality of buried contacts BC may be formed between two adjacent bit lines from among the plurality of bit lines BL. The plurality of buried contacts BC may be arranged in a matrix in the first direction (X direction) and the second direction (Y direction). A plurality of landing pads LP may be formed on the plurality of buried contacts BC. The plurality of buried contacts BC and the plurality of landing pads LP may be used to connect, to the cell active regions A1, a bottom electrode of a capacitor that is formed on the plurality of bit lines BL. The plurality of landing pads LP may be arranged to each partially overlap the buried contacts BC along the direction orthogonal to the upper surface of the substrate 12.

Figure 11A:
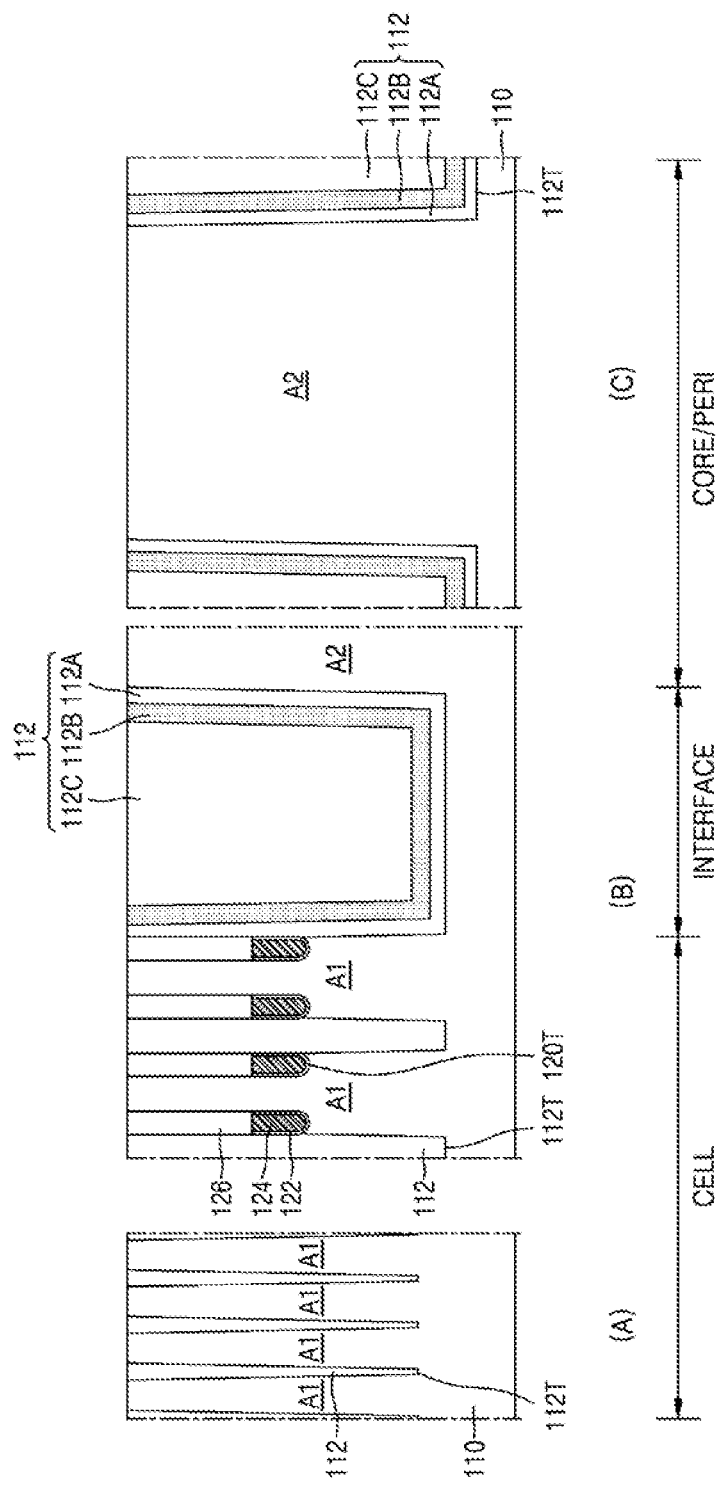
FIGS. 11A through 11P are cross-sectional views illustrating a method of manufacturing an integrated circuit device, according to an exemplary embodiment of the present inventive concept.
Figure 11B:
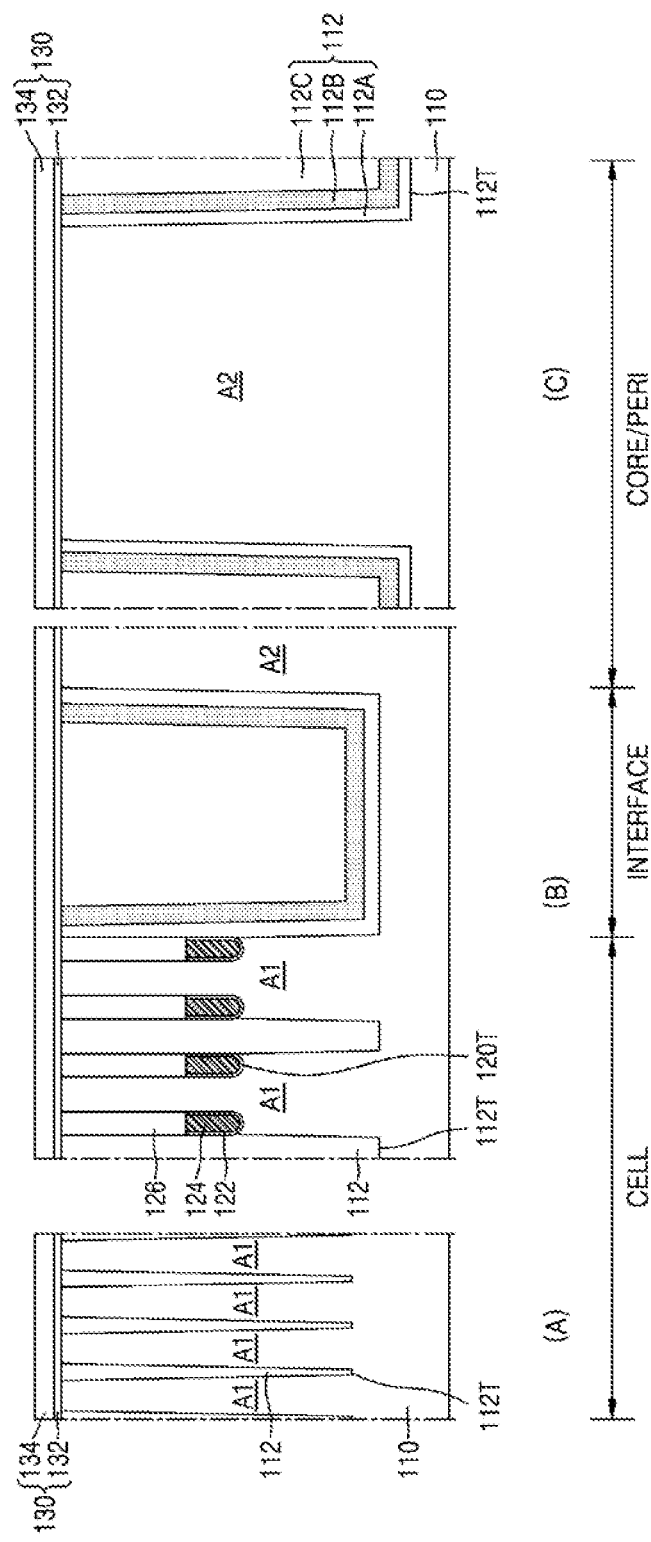
Figure 11C:
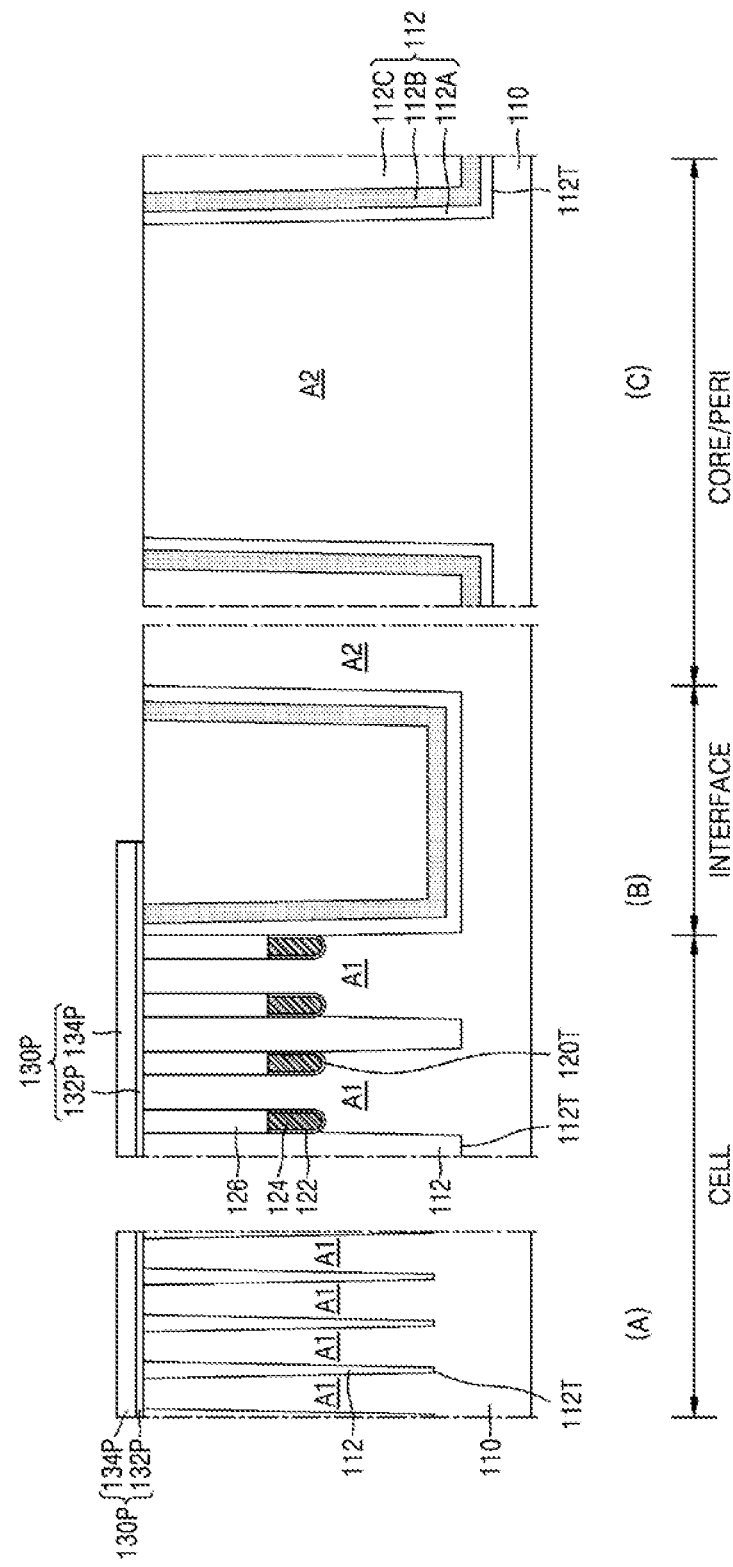
Figure 11D:
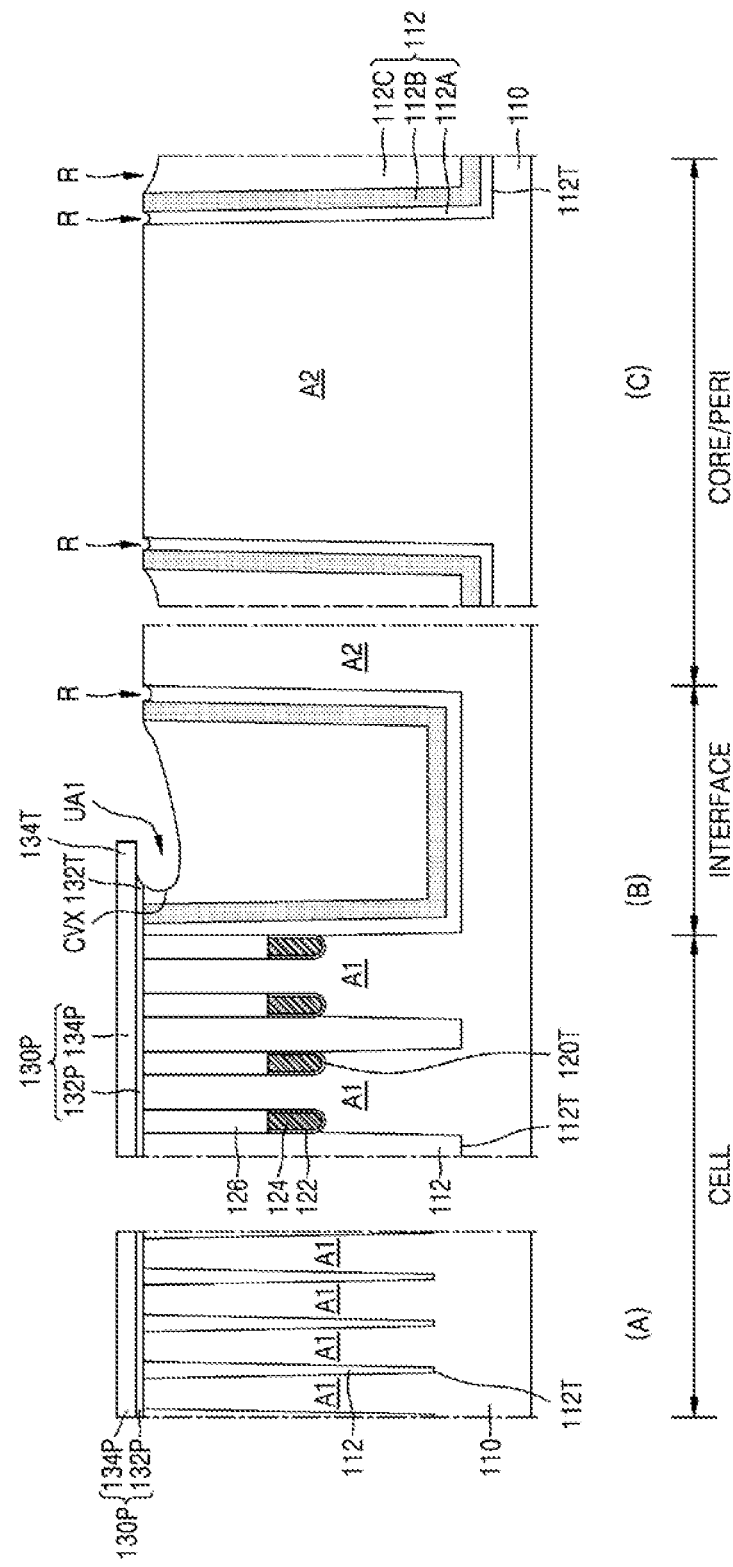
Figure 11E:
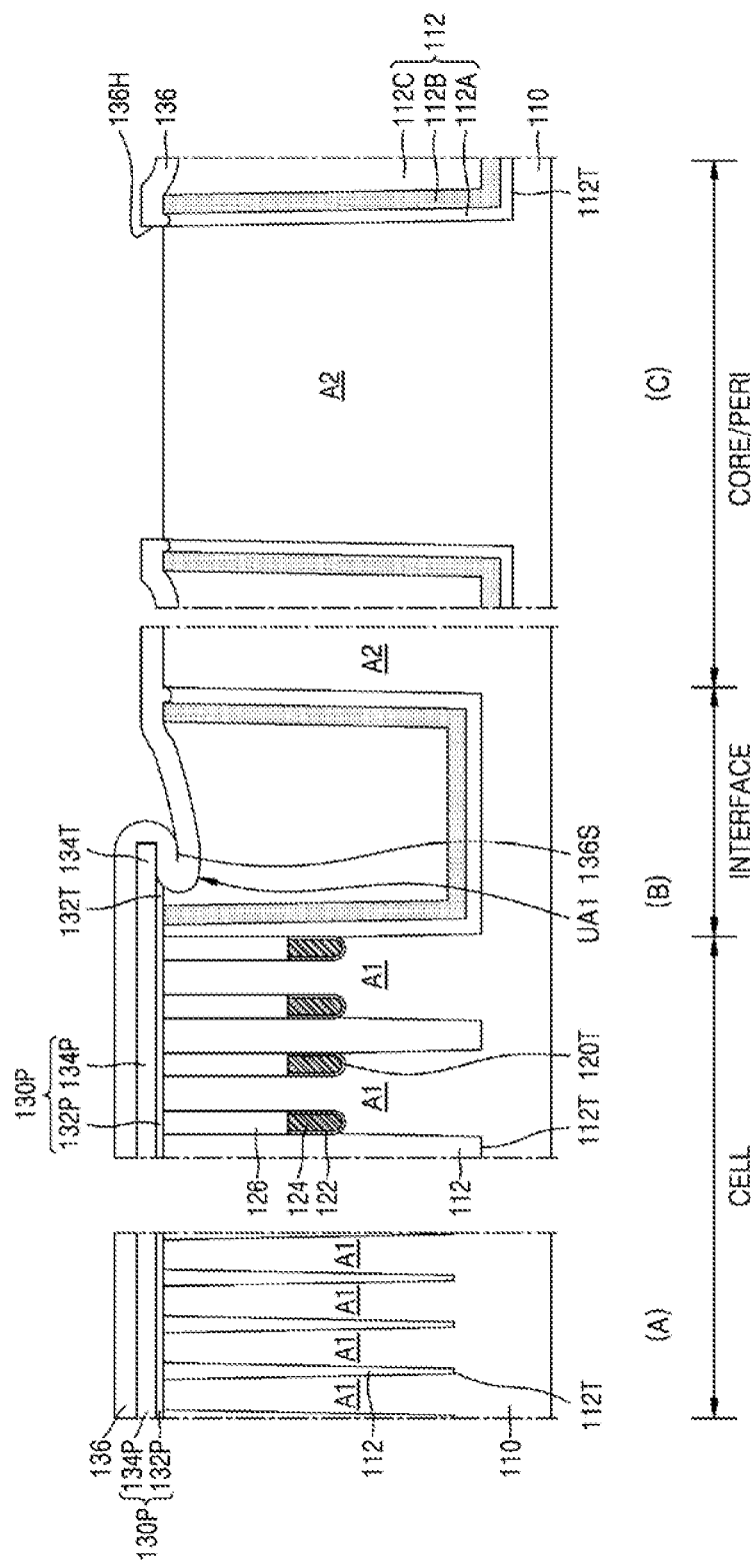
Figure 11F:
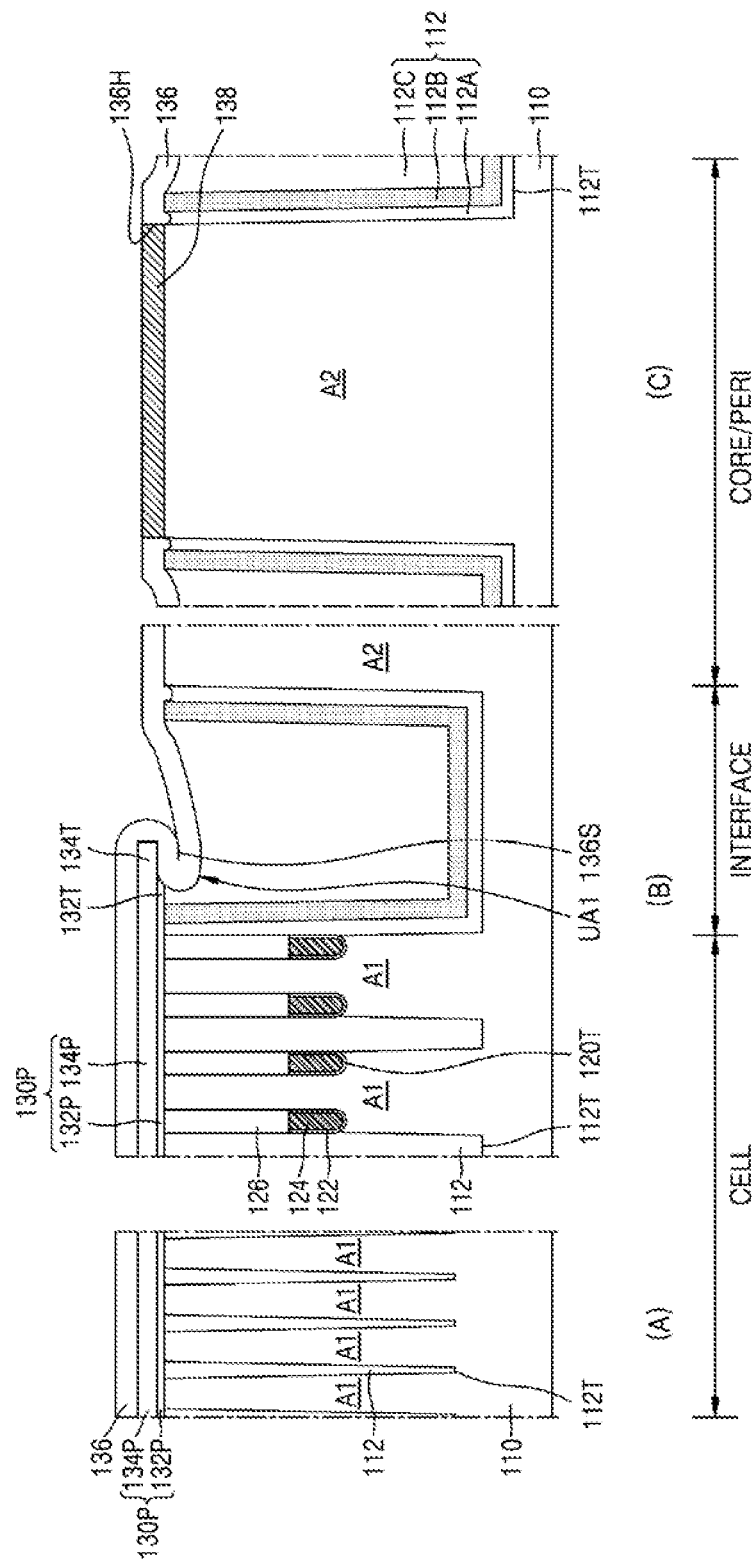
Figure 11G:
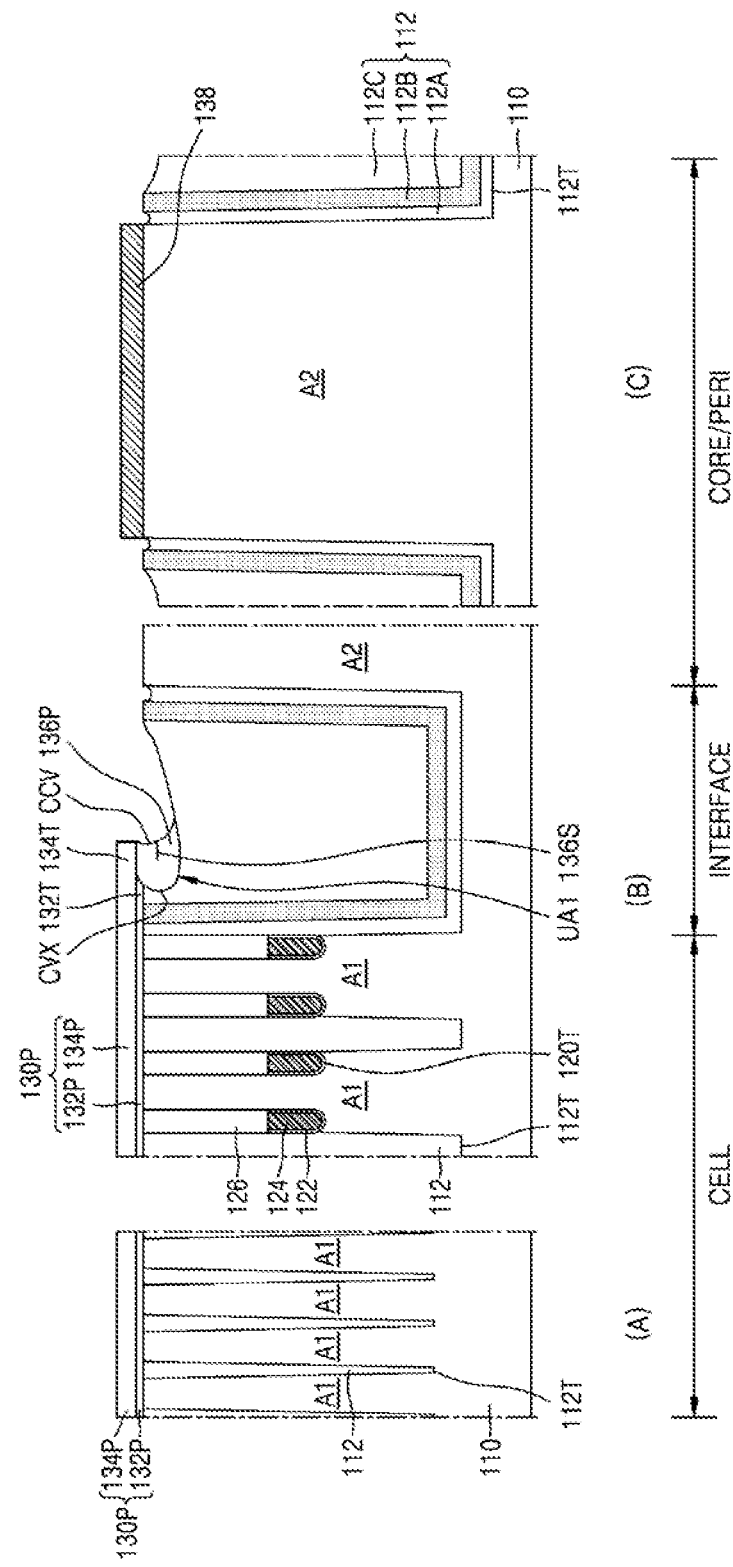
Figure 11H:
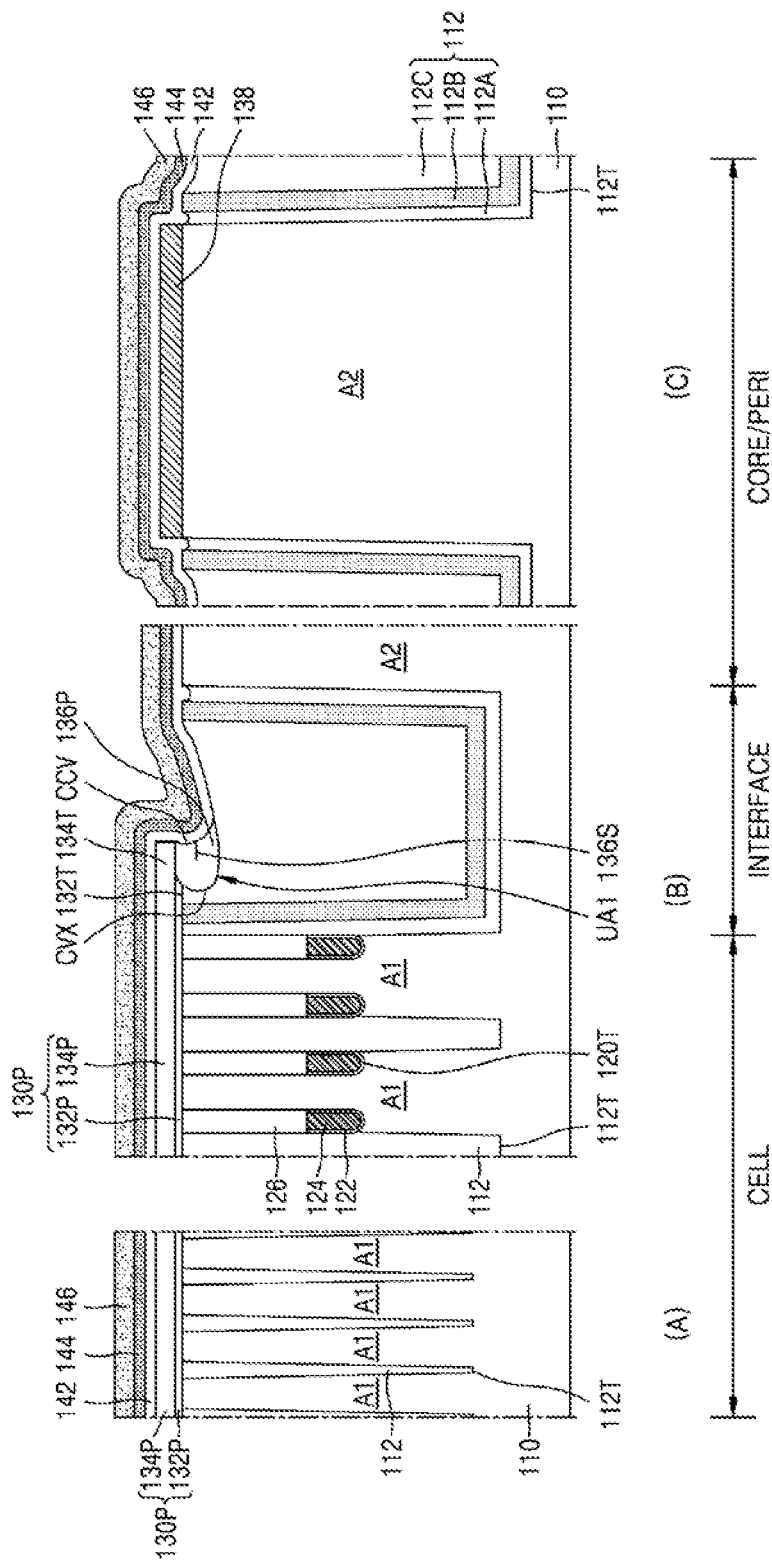
Figure 11I:
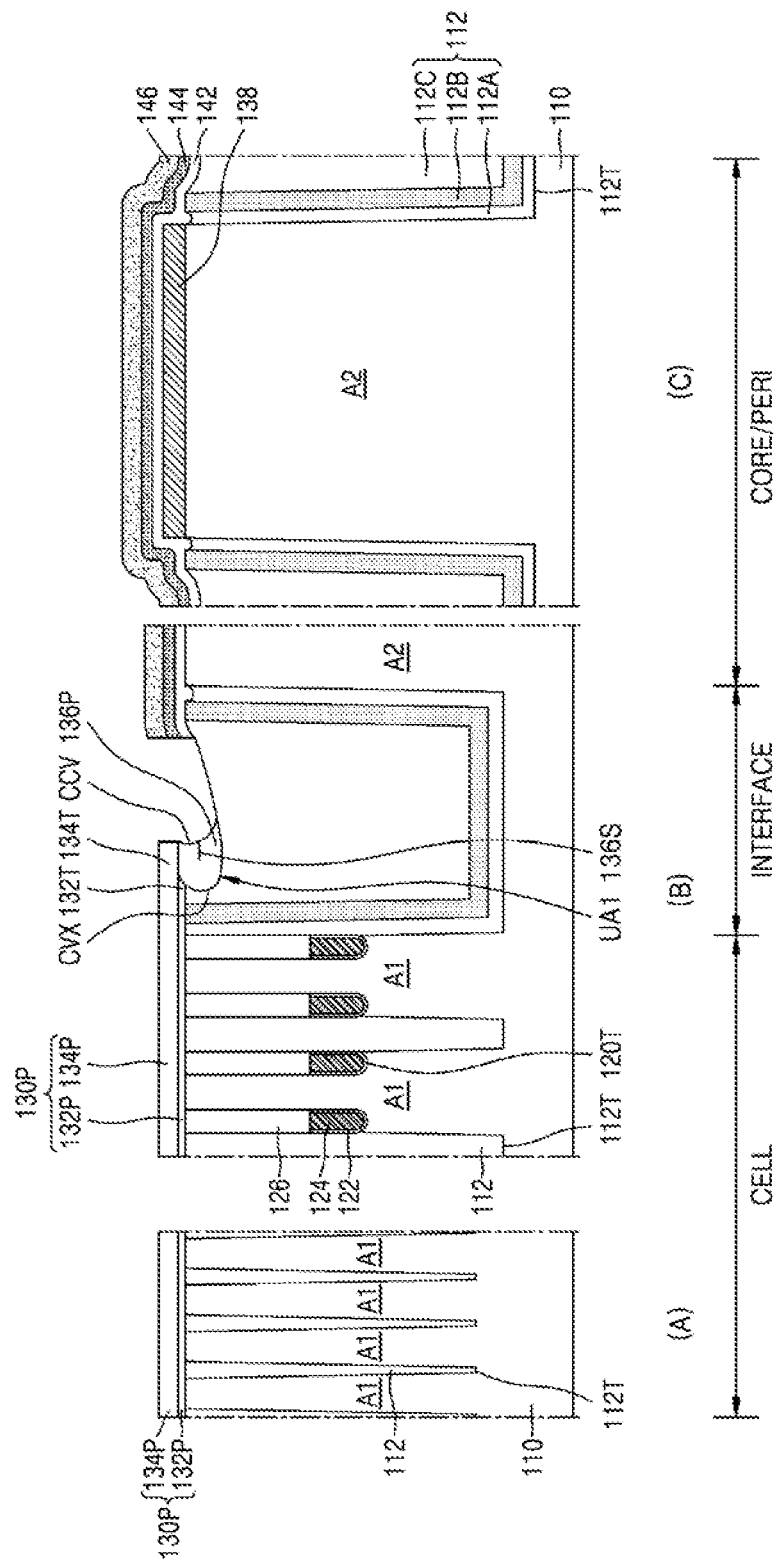
Figure 11J:
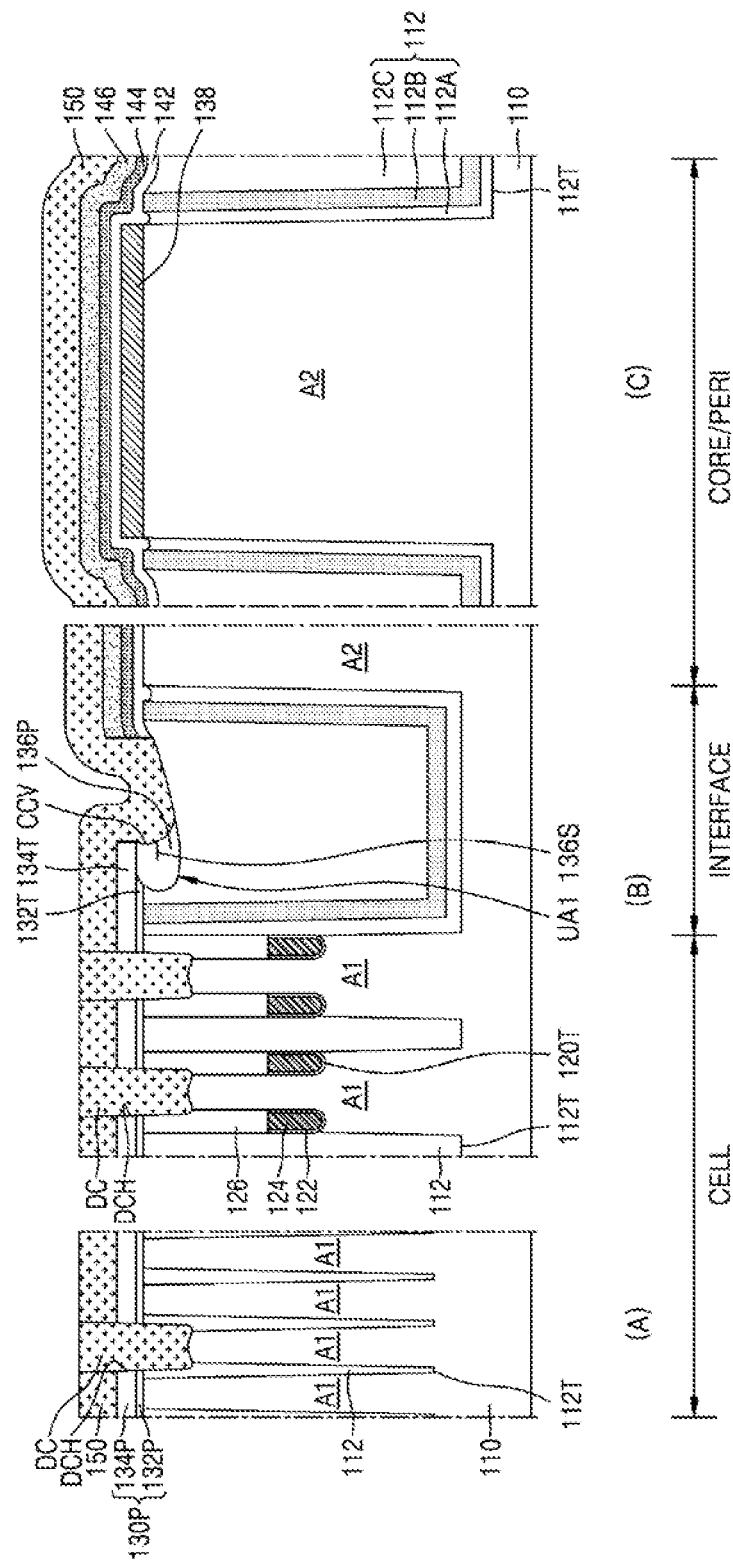
Figure 11K:
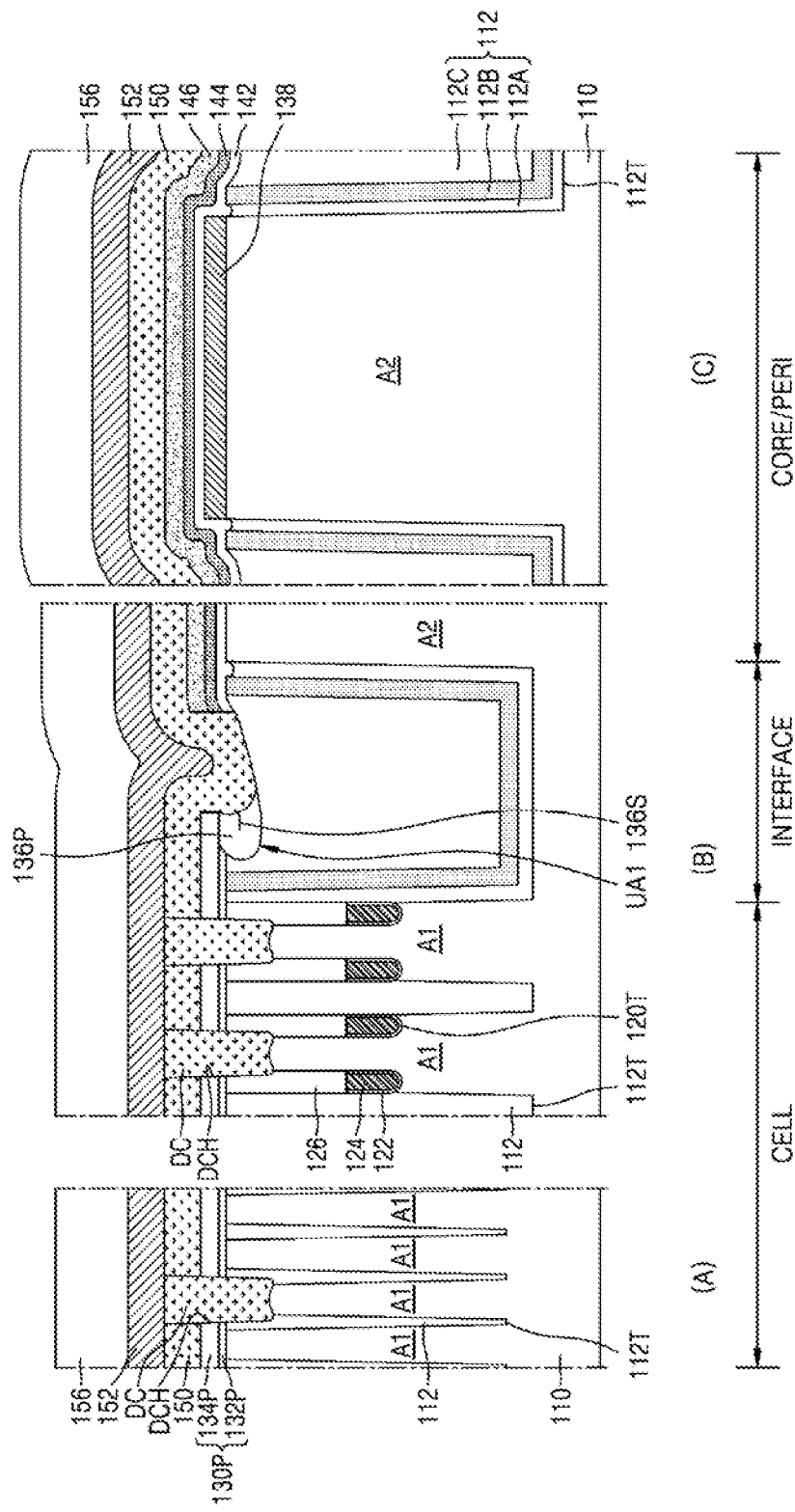
Figure 11L:
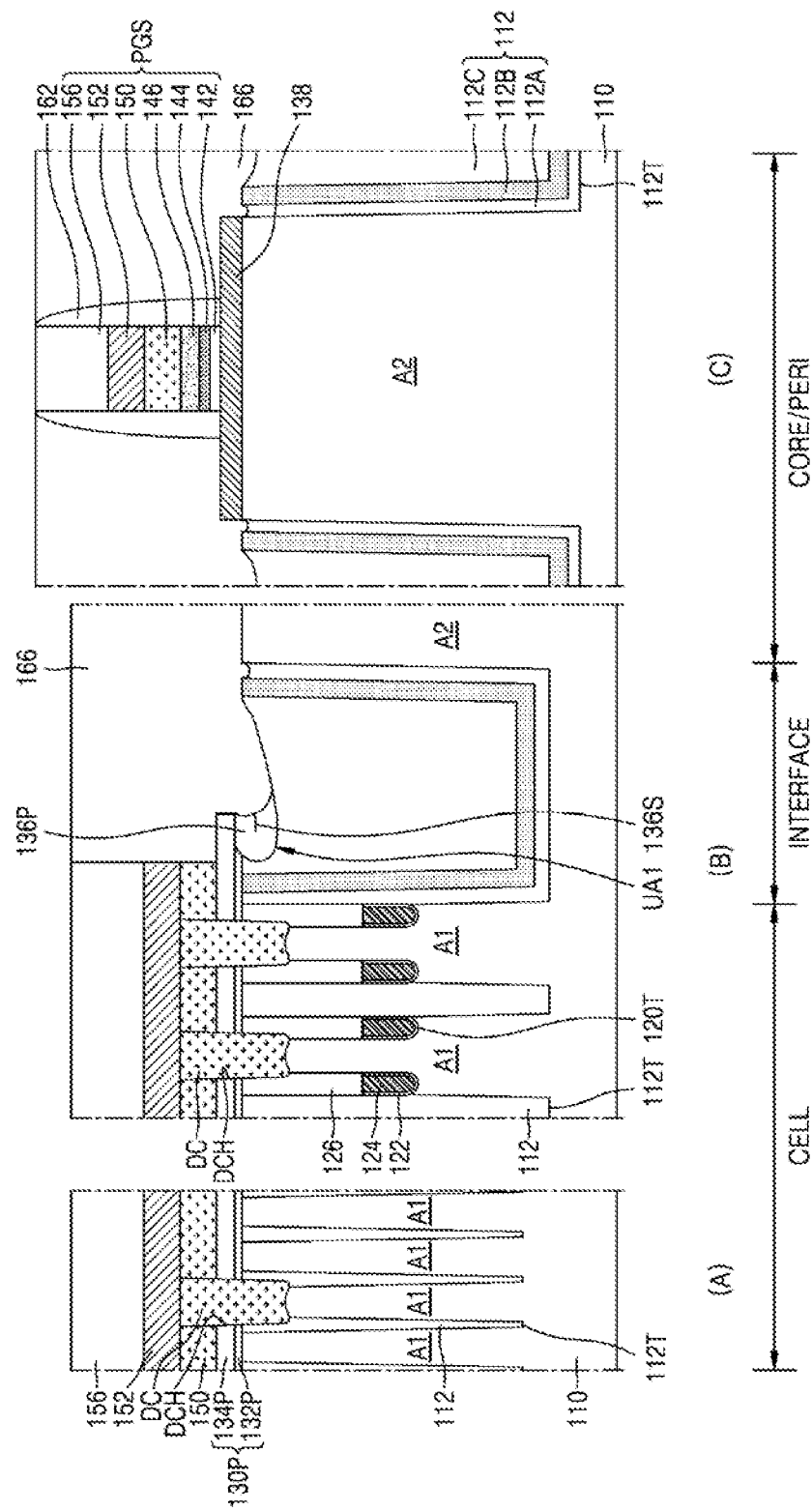
Figure 11M:
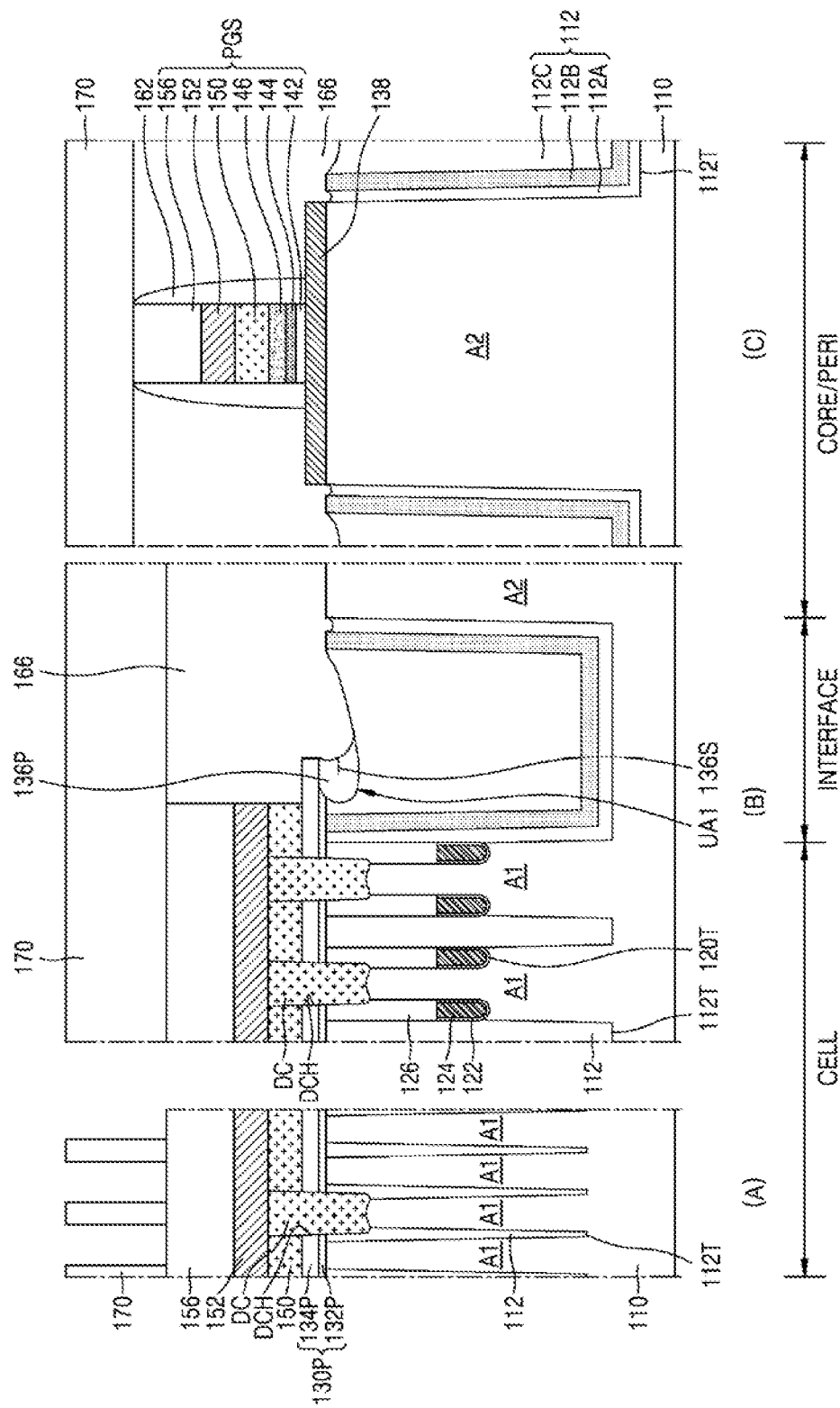
Figure 11N:
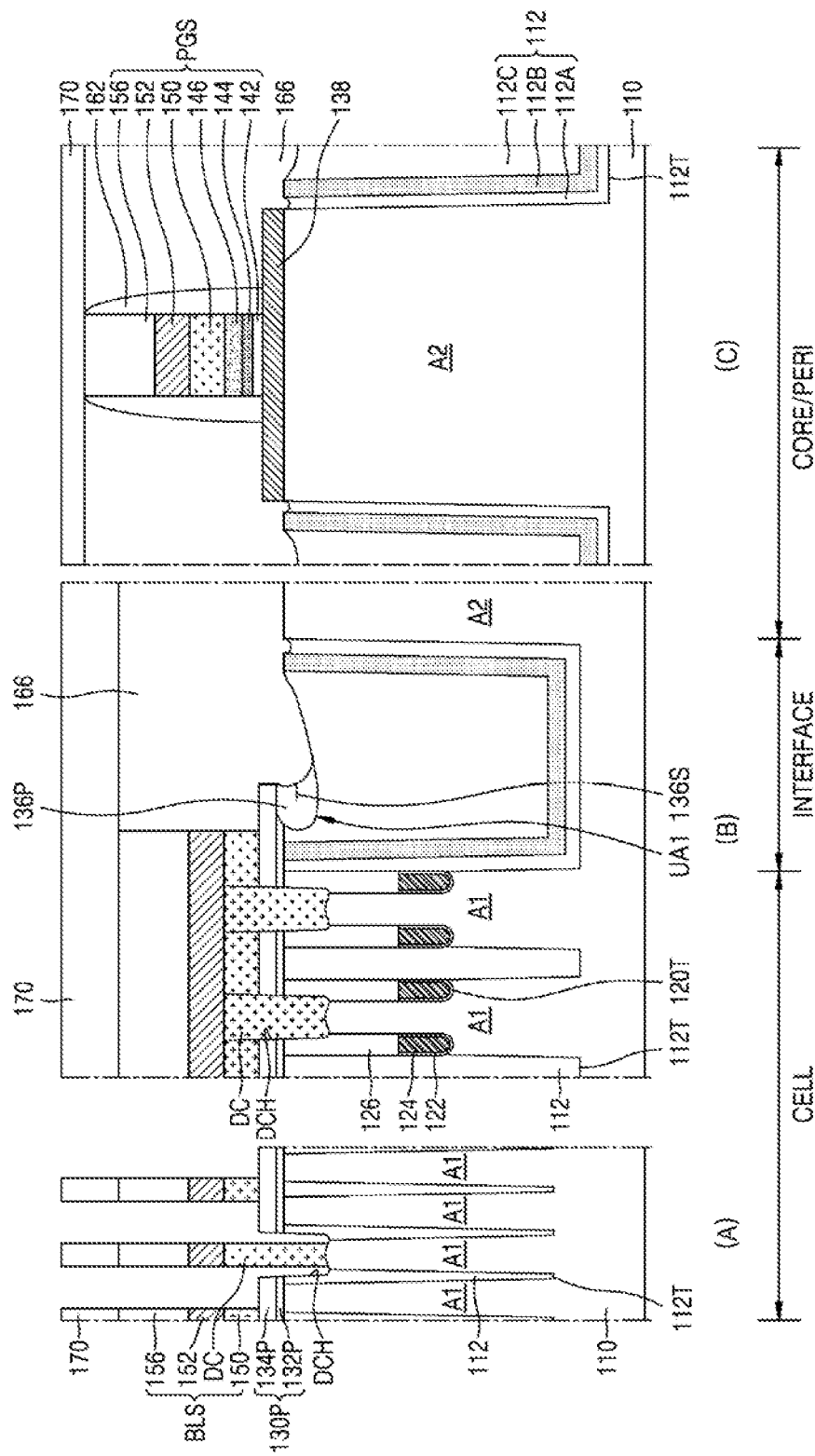
Figure 11P:
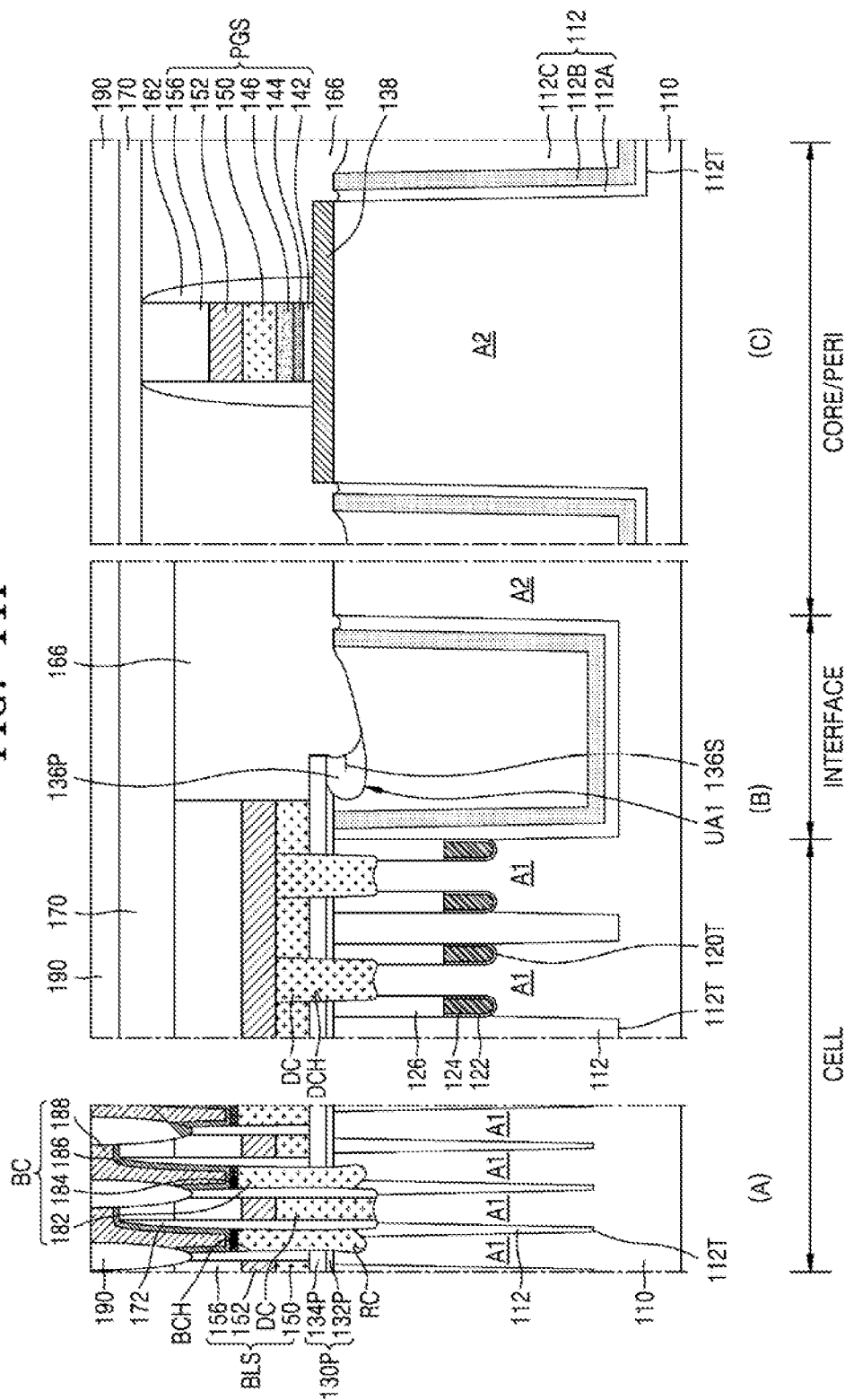

FIGS. 11A through 11P are cross-sectional views illustrating a method of manufacturing an integrated circuit device, according to an exemplary embodiment of the present inventive concept. A method of manufacturing an integrated circuit device including the DRAM device having the structure described with reference to FIGS. 8 through 10 will be described in more detail below with reference to FIGS. 11A through 11P.

FIGS. 11A through 11P illustrate cross-sectional structures of a cell array region CELL, a peripheral circuit region CORE/PERI, and an interface region INTERFACE. The cell array region CELL, may include at least a portion of the first region 22 described with reference to FIGS. 1 and 9. The interface region INTERFACE may include at least portion of the interface region 26 described with reference to FIGS. 1 and 9. The peripheral circuit region CORE/PERI may include at least a portion of the second region 24 described with reference to FIGS. 1 and 9. In FIGS. 11A through 11P, a cross-section denoted by (A) may correspond to a partial region of FIG. 10 along a cross-section taken along line A-A', and a cross-section denoted by (B) may correspond to a partial region of FIG. 10 along a cross-section taken along line B-B' and a partial region of the interface region INTERFACE adjacent to the above partial region.

Referring to FIG. 11A, a substrate 110 including a cell array region CELL, a peripheral circuit region CORE/PERI, and an interface region INTERFACE positioned therebetween may be provided. The cell array region CELL and the peripheral circuit region CORE/PERI may be spaced apart from each other along a direction parallel to an upper surface of the substrate 110. After forming a plurality of device isolation trenches 112T in the substrate 110, a plurality of device isolation layers 112 filling the plurality of device isolation trenches 112T may be formed. A plurality of cell active regions A1 may be defined on the substrate 110 in the cell array region CELL by the plurality of device isolation layers 112, and a peripheral circuit active region A2 may be defined in the peripheral circuit region CORE/PERI. The plurality of cell active regions A1 may each have a relatively long and planar island-type shape having a short axis and a long axis (see, e.g., FIG. 10). The interface region INTERFACE may be defined by a device isolation layer 112 positioned between the cell active region A1 and the peripheral circuit active region A2 from among the plurality of device isolation layers 112. The device isolation layer 112 in the interface region INTERFACE may extend along a periphery of the cell array region CELL so as to have a shape surrounding the cell array region CELL when viewed from a plan view. From among the plurality of device isolation layers 112, a width of the device isolation layer 112 arranged in the cell array region CELL may be smaller than a width of the device isolation layer 112 disposed in the interface region INTERFACE along a direction orthogonal to an upper surface of the substrate 110.

The substrate 110 may have substantially the same structure as the substrate 12 described with reference to FIG. 2A. The device isolation layer 112 may include a silicon oxide layer, a silicon nitride layer, or a combination thereof; however, exemplary embodiments of the present inventive concept are not limited thereto. The device isolation layer 112 may include a single layer including a single insulating material, or a dual layer including two layers each including a different insulating material, or a multi-layer including at least two layers each including a different insulating material.

In the peripheral circuit region CORE/PERI and the interface region INTERFACE, the device isolation layer 112 may include a first insulation liner 112A and a second insulation liner 112B sequentially formed on an internal wall of the device isolation trench 112T, and a buried insulating layer 112C on the second insulation liner 112B and filling the device isolation trench 112T. In an exemplary embodiment of the present inventive concept, the first insulation liner 112A may include an oxide layer, the second insulation liner 112B may include a nitride layer, and the buried insulating layer 112C may include an oxide layer.

In an exemplary embodiment of the present inventive concept, an oxide layer included in the first insulation liner 112A may be a medium temperature oxidation (MTO) layer, a high density plasma (HDP) oxide layer, a thermal oxide layer, a tetraethyl orthosilicate (TEOS) layer, or an undoped silicate glass (USG) layer. The second insulation liner 112B may be a silicon nitride layer. In an exemplary embodiment of the present inventive concept, an oxide layer forming the buried insulating layer 112C may be a Tonen silazane (TOSZ), an HDP oxide layer or a USG oxide layer. In an exemplary embodiment of the present inventive concept, an oxide layer forming the buried insulating layer 112C may be a silicate, siloxane, methyl silsesquioxane (MSQ), hydrogen silsesquioxane (HSQ), polysilazane, or a spin-on-glass (SOG) oxide layer including a combination thereof.

In the cell array region CELL, a plurality of word line trenches 120T extending in parallel to each other may be formed in the substrate 110. After cleaning a resultant product on which the plurality of word line trenches 120T are formed, a gate dielectric layer 122, a word line 124, and a buried insulating layer 126 may be sequentially formed in each of the plurality of word line trenches 120T. The plurality of word lines 124 may be the plurality of word lines WL described with reference to FIG. 10.

A plurality of source/drain regions may be formed on an upper surface of the plurality of cell active regions A1 by injecting impurity ions into both portions of the plurality of word lines 124 in the plurality of cell active regions A1. In an exemplary embodiment of the present inventive concept, the source/drain regions may also be formed before forming of the plurality of word lines 124.

The plurality of gate dielectric layers 122 may include a silicon oxide layer, a silicon nitride layer, a silicon oxynitride layer, an oxide/nitride/oxide (ONO) layer, or a high-k dielectric film having a higher dielectric constant than a silicon oxide layer. For example, the plurality of gate dielectric layers 122 may have a dielectric constant of from about 10 to about 25. In an exemplary embodiment of the present inventive concept, the plurality of gate dielectric layers 122 may include $HfO_2$, $Al_2O_3$, $HfAlO_3$, $Ta_2O_3$, or $TiO_2$. The plurality of word lines 124 may be formed of Ti, TiN, Ta, TaN, W, WN, TiSiN, WSiN, or a combination thereof. The plurality of buried insulating layers 126 may include a silicon oxide layer, a silicon nitride layer, a silicon oxynitride layer, or a combination thereof.

Referring to FIG. 11B, an insulating layer 130 may be formed on the substrate 110 in the cell array region CELL, the interface region INTERFACE, and the peripheral circuit region. CORE/PERI. The insulating layer 130 may include a first insulating layer 132 and a second insulating layer 134 sequentially formed on the substrate 110. The first insulating layer 132 and the second insulating layer 134 may each include different insulating materials. For example, the first insulating layer 132 may include an oxide layer, and the second insulating layer 134 may include a nitride layer; however, exemplary embodiments of the present inventive concept are not limited thereto.

Referring to FIG. 11C, an insulation pattern 130P may be formed by removing a portion of the insulating layer 130. To form the insulation pattern 130P, a first insulation pattern 132P and a second insulation pattern 134P may be formed by removing portions of the first insulating layer 132 and the second insulating layer 134.

To form the first insulation pattern 132P and the second insulation pattern 134P, portions of the first insulating layer 132 and the second insulating layer 134 covering the peripheral circuit region CORE/PERI and a portion of the interface region INTERFACE may be removed. Thus, the first insulation pattern 132P and the second insulation pattern 134P covering the cell array region CELL and a portion of the interface region INTERFACE that is adjacent to the cell array region CELL may remain.

In an exemplary embodiment of the present inventive concept, to remove portions of the first insulating layer 132 and the second insulating layer 134, a dry etching method, a wet etching method, or a combination thereof may be used. In an exemplary embodiment of the present inventive concept, the insulating layer 130 may be covered with a mask pattern, and then the mask pattern may be used as an etching mask to sequentially dry-etch the second insulating layer 134 and the first insulating layer 132 to thus form the second insulation pattern 134P and the first insulation pattern 132P. In an exemplary embodiment of the present inventive concept, a portion of the second insulating layer 134 may be dry-etched by using the mask pattern as an etching mask, to thus form the second insulation pattern 134P exposing the first insulating layer 132, and then the exposed first insulating layer 132 may be wet-etched to form the first insulation pattern 132P.

After the first insulation pattern 132P and the second insulation pattern 134P are formed, an upper surface of the peripheral circuit active region A2 may be exposed in the peripheral circuit region CORE/PERI.

Referring to FIG. 11D, an undesired natural oxide layer on the peripheral circuit active region A2 may be removed by cleaning an exposed surface of the peripheral circuit active region A2 in the peripheral circuit region CORE/PERI. In an exemplary embodiment of the present inventive concept, a plasma dry cleaning operation may be used to clean the exposed surface of the peripheral circuit active region A2. During the plasma dry cleaning operation, a hydrogen gas may be used as a cleaning gas. By using the hydrogen gas, an undesired natural oxide layer on the peripheral circuit active region A2 may be reduced or eliminated. For example, plasma may be generated by injecting a process gas including $H_2$ and $SiH_2$ into a plasma generator, and then a surface of the peripheral circuit active region A2 may be cleaned using a radical activated by the generated plasma. In an exemplary embodiment of the present inventive concept, a wet cleaning operation may be used to clean the exposed surface of the peripheral circuit active region A2. The wet cleaning operation may be performed using an HF solution.

During the cleaning operation in which an undesired natural oxide layer is removed from the exposed surface of the peripheral circuit active region A2, a portion of the interface region INTERFACE and the peripheral circuit region CORE/PERI may be exposed to the cleaning atmosphere of the cleaning operation, and as a result, portions of the device isolation layer 112 that are in the interface region INTERFACE and the peripheral circuit region CORE/PERI and include an oxide may also be partially consumed by the cleaning atmosphere so as to form a recess R in an upper portion of each of the first insulation liner 112A and the buried insulating layer 112C. For example, in the interface region INTERFACE, the buried insulating layer 112C of the device isolation layer 112 and the first insulation pattern 132P may be consumed together by the cleaning atmosphere under a terminal portion 134T of the second insulation pattern 134P to form an undercut region UA1 under the terminal portion 134T of the second insulation pattern 134P. The undercut region UA1 may be defined by a convex surface CVX that extends convexly toward the cell array region CELL. The convex surface CVX may be defined by a terminal portion 132T of the first insulation pattern 132P and an upper surface of the buried insulating layer 112C. The undercut region UA1 may be formed to have an opening facing the peripheral circuit region CORE/PERI.

Referring to FIG. 11E, a buried mask layer 136 burying the undercut region UA1 may be formed on the substrate

110. The buried mask layer 136 may be formed to have a thickness sufficient to fill the undercut region UA1.

The buried mask layer 136 may prevent epitaxial growth in undesired portions on the substrate 110. The buried mask layer 136 may include a hole 136H exposing a region of the peripheral circuit active region A2 of the peripheral circuit region CORE/PERI that is formed by an epitaxial growth process of a semiconductor layer. While one hole 136H is illustrated in FIG. 11E, exemplary embodiments of the present inventive concept are not limited thereto, and a plurality of holes 136H may be formed in the buried mask layer 136 to expose different regions of the peripheral circuit active areas A2.

In an exemplary embodiment of the present inventive concept, referring to FIG. 11E, a seam portion 136S having a line shape may be formed at a portion of the buried mask layer 136 that fills the undercut region UA1. The seam portion 136S may be formed because layers used to form the buried mask layer 136 are continually built up from an inner surface of the undercut region UA1 while facing each other during a process of forming the buried mask layer 136, such that the layers end up contacting each other approximately in a center portion of the undercut region UA1. The seam portion 136S may have a line shape extending toward the entrance of the undercut region UA1 according to a cross-sectional view of the buried mask layer 136.

In an exemplary embodiment of the present inventive concept, the seam portion 136S or a seam portion having a similar shape need not be left in the undercut region UA1 after the buried mask layer 136 is formed. In an exemplary embodiment of the present inventive concept, after forming the buried mask layer 136, an air gap having a similar shape as the air gap AG1 described with reference to FIG. 4 or the air gap AG2 described with reference to FIG. 7 may be left in a region adjacent to the seam portion 136S within the undercut region UA1.

The buried mask layer 136 may include an insulating film not including a metal. For example, the buried mask layer 136 may include a silicon oxide, a silicon nitride, a silicon oxynitride (SiON), a silicon oxynitride (SiOCN), polysilicon, or a combination thereof; however, exemplary embodiments of the present inventive concept are not limited thereto.

A chemical vapor deposition (CVD) process or an atomic layer deposition (ALD) process may be used to form the buried mask layer 136; however, exemplary embodiments of the present inventive concept are not limited thereto.

Referring to FIG. 11F, the buried mask layer 136 may be used as an epitaxial growth-preventing mask to perform a selective epitaxial growth process to grow a semiconductor material from a surface of the peripheral circuit active region A2 exposed through the hole 136H of the buried mask layer 136, thus forming a semiconductor layer 138.

The semiconductor layer 138 may include a compound semiconductor formed of a combination of elements of Group IV of the periodic table according to International Union of Pure and Applied Chemistry (IUPAC). For example, the semiconductor layer 138 may include SiGe. In an exemplary embodiment of the present inventive concept, the semiconductor layer 138 may have a thickness of about 20 Å to about 200 Å (e.g., along the direction orthogonal to the upper surface of the substrate 110). When the semiconductor layer 138 includes SiGe, a Ge content in the semiconductor layer 138 may be about 10 atom % (at %) to about 50 atom % (at. %).

In an exemplary embodiment of the present inventive concept, the device isolation layer 112 adjacent to the peripheral circuit active region A2 may also be exposed through the hole 136H of the buried mask layer 136. In this case, during the selective epitaxial process, the semiconductor layer 138 may be formed only on a surface of the peripheral circuit active region A2, and need not be formed on the device isolation layer 112.

Referring to FIG. 11G, the buried mask layer 136 may be isotropically etched such that a portion of the buried mask layer 136 filling the undercut region UA1 remains and the other portion of the buried mask layer 136 is removed. The portion of the buried mask layer 136 that fills the undercut region UA1 may be left as a buried pattern 136P. After the buried pattern 136P is formed, the second insulation pattern 134P may be exposed in the cell array region CELL, and an upper surface of the device isolation layer 112 may be exposed in the interface region INTERFACE and the peripheral circuit region CORE/PERI.

The buried pattern 136P may extend along a periphery of the cell array region CELL to have a closed loop shape surrounding the cell array region CELL (e.g., when viewed in a plan view).

In an exemplary embodiment of the present inventive concept, the seam portion 136S may be left in the buried pattern 136P. In an exemplary embodiment of the present inventive concept, the seam portion 136S need not be left in the buried pattern 136P. In an exemplary embodiment of the present inventive concept, an air gap having a shape similar to the air gap AG1 described with reference to FIG. 4 or the air gap AG2 described with reference to FIG. 7 may be left in a region in the buried pattern 136P adjacent to the seam portion 136S. The buried pattern 136P may include the convex surface CVX facing the cell array region CELL and the concave surface CCV recessed towards a center of the buried pattern 136P. The concave surface CCV may face the peripheral circuit region CORE/PERI. In the interface region INTERFACE, the convex surface CVX of the buried pattern 136P may be in direct contact with the terminal portion 132T of the first insulation pattern 132P. In the interface region INTERFACE, an interface between the device isolation layer 112 and the buried pattern 136P may be a curved surface due to the convex surface CVX of the buried pattern 136P.

In the interface region INTERFACE, as the undercut area UA1 between the device isolation layer 112 and the second insulation pattern 134P is filled with the buried pattern 136P, undesirable contaminants, particularly, of metal particles, may be prevented from penetrating or remaining in the undercut region UA1 during subsequent processes.

Referring to FIG. 11H, a first dielectric layer 142, a second dielectric layer 144, and a work function controlling layer 146 including a metal may be sequentially formed on the substrate 110 in the cell array region CELL, the interface region INTERFACE, and the peripheral circuit region CORE/PERI of the substrate 110.

The first dielectric layer 142 may include, for example, a silicon oxide layer, a silicon nitride layer, a silicon oxynitride layer, or an oxide/nitride/oxide (ONO) layer. The first dielectric layer 142 may have a smaller thickness than the semiconductor layer 138 formed in the peripheral circuit region CORE/PERI (e.g., along the direction orthogonal to the upper surface of the substrate 110). The first dielectric layer 142 may be formed using a CVD process or an ALD process.

The second dielectric layer 144 may include a high-k dielectric layer having a dielectric constant higher than a silicon oxide layer. The second dielectric, layer 144 may have a higher dielectric constant than the first dielectric layer 142. The second dielectric layer 144 may layer including metal and having a dielectric constant of from about 10 to about 25. For example, the second dielectric layer 144 may include $HfO_2$, $Al_2O_3$, $HfAlO_3$, $Ta_2O_3$, or $TiO_2$. The second dielectric layer 144 may have a smaller thickness than the first dielectric layer 142 (e.g., along the direction orthogonal to the upper surface of the substrate 110).

The work function controlling layer 146 including a metal may include a metal, a conductive metal nitride, a conductive metal carbide, a conductor containing a metal atom, or a combination thereof. The work function controlling layer 146 including a metal may have a single-layered or multi-layered structure. The work function controlling layer 146 including a metal may include at least one material selected from Ti, Ta, Al, Ni, Co, La, Pd, Nb, Mo, Hf, Ir, Ru, Pt, Yb, Dy, Er, Pd, TiAl, HfSiMo, TiN, WN, TaN, RuN, MoN, TiAlN, TaC, TiC, or TaC. In an exemplary embodiment of the present inventive concept, the work function controlling layer 146 including a metal may include at least one stack structure selected from TiN/TiN, TiN/TiON, TiN/TiN, TaN/TiN, La/TiN, Al/TiN, Mg/TiN, or Sr/TiN. Here, TiN may be replaced by TaN, TaCN, TiCN, CoN, or CoCN, and La may be replaced by LaO or LaON.

Since the operations of forming the first dielectric layer 142, the second dielectric layer 144, and the work function controlling layer 146 including a metal are performed while the undercut region UA1 is filled with the buried pattern 136P, the first dielectric layer 142, the second dielectric layer 144, and the work function controlling layer 146 including a metal are not formed in the undercut region UA1.

Referring to FIG. 11I, a portion of each of the first dielectric layer 142, the second dielectric layer 144, and the work function controlling layer 146 including a metal may be removed to expose the second insulation pattern 134P and the buried pattern 136P.

To expose the second insulation pattern 134P and the buried pattern 136P in the cell array region CELL and the interface region INTERFACE, an etching process may be performed to remove portions of the first dielectric layer 142, the second dielectric layer 144, and the work function controlling layers 146 including a metal that cover the cell array region CELL, and a portion of the interface region INTERFACE adjacent to the cell array region CELL. Thus, remaining portions of the first dielectric layer 142, the second dielectric layer 144, and the work function controlling layer 146 including a metal may cover only the peripheral circuit region CORE/PERI and a portion of the interface region INTERFACE that is adjacent to the peripheral circuit region CORE/PERI.

While the first dielectric layer 142, the second dielectric layer 144, and the work function controlling layer 146 including a metal are being etched in the cell array region CELL and the interface region INTERFACE, metal elements included in the second dielectric layer 144 and/or the work function controlling layer 146 including a metal may remain on the substrate 110 as a by-product or residue to act as a metal contamination source. For example, if the undercut region UA1 is not filled with the buried pattern 136P, the metal contamination source may be deposited in the undercut region UA1. In this case, even if a cleaning process is performed to remove the metal contamination source, it may be difficult to remove the metal contamination source remaining in deep portions of the undercut region UA1. If a subsequent process is performed in a state where a metal contaminant remains in deep portions of the undercut region UA1, for example, during an etching process of forming a plurality of bit lines in the cell array region CELL in a subsequent process, or during an etching process of forming a plurality of contact plugs between a plurality of bits lines, the metal contamination source remaining in the deep portions of the undercut region UA1 may be undesirably exposed, and this may degrade electric characteristics and reliability of a device to be manufactured.

However, according to the method of manufacturing an integrated circuit device according to an exemplary embodiment of the present inventive concept, the first dielectric layer 142, the second dielectric layer 144, and the second dielectric layer 144 may be etched while the undercut region UA1 is filled with the buried pattern 136P, and thus, when a metal contamination source remains in the interface region INTERFACE on the substrate 110 as a result of etching the first dielectric layer 142, the second dielectric layer 144, and the work function controlling layer 146 including a metal, the remaining metal contamination source may be relatively easily eliminated through a cleaning process. Thus, subsequent processes may be performed while an exposed surface of each of the second insulation pattern 134P, the buried pattern 136P, and the device isolation layer 112 exposed in the cell array region CELL and the interface region INTERFACE is not contaminated.

Referring to FIG. 11J, a first conductive layer 150 extending on the substrate 110 in the cell array region CELL, the interface region INTERFACE, and the peripheral circuit region CORE/PERI may be formed, and then, in the cell array region CELL, a portion of each of the first conductive layer 150, the second insulation pattern 134P, and the first insulation pattern 132P, and a portion of the substrate 110, may be etched to form a plurality of direct contact holes DCH that pass through the first conductive layer 150, the second insulation pattern 134P, and the first insulation pattern 132P to expose the cell active region A1. A plurality of direct contacts DC may be formed to fill the plurality of direct contact holes DCH.

The first conductive layer 150 may include doped polysilicon or a metal such as W, Mo, Au, Cu, Al, Ni, or Co. The first conductive layer 150 may include a single layer including one material selected from the above-described materials, or a multi-layer including at least two layers each respectively including a different one of the above-described materials from each other.

The direct contacts DC may include doped polysilicon or a metal such as W, Mo, Au, Cu, Al, Ni, or Co. In an exemplary embodiment of the present inventive concept, the direct contacts DC may include the same material as the material of the first conductive layer 150.

In an exemplary embodiment of the present inventive concept, a metal silicide layer may be further formed between the substrate 110 and the direct contacts DC. For example, the metal silicide layer may include tungsten silicide, nickel silicide, or cobalt silicide; however, exemplary embodiments of the present inventive concept are not limited thereto.

Referring to FIG. 11K, a second conductive layer 152 and an insulation capping layer 156 extending on the first conductive layer 150 in the cell array region CELL, the interface region INTERFACE, and the peripheral circuit region CORE/PERI may be formed.

The second conductive layer 152 may include TiSiN, TiN, TaN, CoN, a metal, a metal silicide, or a combination thereof. The metal and the metal silicide may include W, Mo, Au, Cu, Al, Ni, or Co.

The insulating capping layer 156 may include a silicon nitride layer.

Referring to FIG. 11L, while the cell array region CELL and a portion of the interface region INTERFACE adjacent thereto may be protected using a mask pattern, a peripheral circuit stack structure including the first dielectric layer 142, the second dielectric layer 144, the work function controlling layer 146 including a metal, the first conductive layer 150, the second conductive layer 152, and the insulating capping layer 156 may be etched in the peripheral circuit area CORE/PERI and a periphery thereof to form a peripheral circuit gate structure PGS in the peripheral circuit region CORE/PERI.

While etching the peripheral circuit stack structure to form the peripheral circuit gate structure PGS in the peripheral circuit region CORE/PERI, the interface region INTERFACE may be exposed to the etching atmosphere of the peripheral circuit stack structure. If the undercut region UA1 is not filled with the buried pattern 136P and a metal contamination source remains in the undercut region UA1, the metal contamination source may be scattered in the etching atmosphere, and thus, the peripheral circuit gate structure PGS may be directly exposed to the metal contamination source such that it becomes contaminated. Alternatively, new metal contaminants may be deposited in the undercut region UA1 while etching the peripheral circuit stack structure. However, according to the method of manufacturing an integrated circuit device according to an exemplary embodiment of the present inventive concept, while the etching process of the metal-containing layers as described with reference to FIG. 11I and the etching process of the peripheral circuit stack structure as described with reference to FIG. 11L are performed, since the undercut region UA1 is filled with the buried pattern 136P, the metal contamination source does not remain in the undercut region UA1. Thus, the peripheral circuit gate structure PGS is not contaminated by the metal contamination source, and a new metal contamination source is not deposited in the undercut region UA1.

After forming an insulating spacer 162 covering both sidewalls of the peripheral circuit gate structure PGS, an interlayer insulating layer 166 covering the peripheral circuit gate structure PGS and the insulating spacer 162 may be formed.

The insulating spacer 162 may include an oxide layer, a nitride layer, or a combination thereof. The insulating spacer 162 may include a single layer or multiple layers.

The interlayer insulating layer 166 may include an HDP oxide layer or a silicon oxide layer formed by a flowable CVD (FCVD) method.

Referring to FIG. 11M, a mask pattern 170 may be formed above the substrate 110. The peripheral circuit region CORE/PERI and the interface region INTERFACE may be protected by the mask pattern 170, and an upper surface of the insulating capping layer 156 may be partially exposed in the cell array region CELL. The mask pattern 170 may include a silicon nitride layer.

Referring to FIG. 11N, the cell stack structure including the direct contact DC, the first conductive layer 150, the second conductive layer 152, and the insulation capping layer 156 in the cell array region CELL may be etched using the mask pattern 170 as an etching mask to form a plurality of bit line structures BLS extending in parallel to each other in the cell array region CELL. The first conductive layer 150 and the second conductive layer 152 included in the plurality of bit line structures BLS may form the bit line BL (see, e.g., FIG. 10).

While etching the cell stack structure to form the plurality of bit line structures BLS, the interface region INTERFACE surrounding the cell array region CELL may be exposed to the etching atmosphere of the cell stack structure. If the undercut region UA1 is not filled with the buried pattern 136P and a metal contamination source remains in the undercut region UA1, the metal contamination source remaining in the undercut region UA1 may be scattered in the etching atmosphere, and thus, the plurality of bit line structures BLS may be directly exposed to the metal contamination source such that they become contaminated. However, according to the method of manufacturing an integrated circuit according to an exemplary embodiment of the present inventive concept, an etching operation for layers including metal, as described above with reference to FIG. 11I, may be performed while the undercut region UA1, in which metal contamination sources may remain, is filled with the buried pattern 136P, and an etching operation is performed to form a peripheral circuit stack structure as described with reference to FIG. 11L. Thus, the cell stack structure may be etched in the cell array region CELL while no undesirable contamination sources remain in the undercut region UA1. Thus, even if the interface region INTERFACE is exposed to the etching atmosphere of the cell stack structure, the plurality of bit line structures BLS are not contaminated by metal contamination sources.

Referring to FIG. 11O, a plurality of insulation spacers 172 covering both sidewalls of each of the plurality of bit line structures BLS in the cell array region CELL may be formed, and a portion of the substrate 110 and a portion of the device isolation layer 112 exposed through the plurality of insulation spacers 172 may be etched to form a plurality of recesses RC exposing the plurality of cell active regions A1. The plurality of recesses RC may each be communicatively connected to a buried contact hole BCH having a width that is defined by the pair of insulation spacers 172 between two adjacent bit lines structures BLS.

To form the plurality of insulation spacers 172 and the plurality of recesses RC, a spacer insulating layer covering the bit line structures BLS may be formed, and an operation of etching back of the spacer insulating layer and an operation of etching a portion of the substrate 110 and a portion of the device isolation layer 112 may be performed. Similar to the description referring to FIG. 11N, as the etching operation of the layers including metal is performed while the undercut region UA1 surrounding the cell array region CELL is filled with the buried pattern 136P as described above with reference to FIG. 11I, and the etching operation on the peripheral circuit stack structure is performed as described above with reference to FIG. 11L, etching operations to form a plurality of insulation spacers 172 and a plurality of recesses RC may be performed while no contamination sources undesirably remain in the undercut region UA1. Thus, while performing the etching processes, even when the interface region INTERFACE is exposed to the etching atmosphere, the plurality of cell active regions A1 exposed in the plurality of recesses RC are not contaminated by a metal contamination source.

Referring to FIG. 11P, a buried conductive layer 182, a metal silicide layer 184, a conductive barrier layer 186, and a conductive layer 188 may be formed, which are sequentially stacked in the plurality of buried contact holes BCH while filling the plurality of recesses RC between each of the plurality of bit line structures BLS. The conductive layer 182, the metal silicide layer 184, the conductive barrier layer 186, and the conductive layer 188 may form a buried contact BC. Portions of the plurality of conductive layers 188 extending over an upper surface of the plurality of bit line structures BLS may be used as a plurality of landing pads, to which bottom electrodes of capacitors formed in a subsequent process may be connected, and may correspond to the plurality of landing pads LP described with reference to FIG. 10.

A plurality of buried conductive layers 182 may be formed using a CVD process, a PVD process, or an epitaxial growth process. The plurality of buried conductive layers 182 may include an impurity-doped semiconductor material, a metal, a conductive metal nitride, a metal silicide, or a combination thereof.

The plurality of metal silicide layers 184 may include a cobalt silicide, a nickel silicide, or a manganese silicide. In an exemplary embodiment of the present inventive concept, the metal silicide, layer 184 may be omitted.

The plurality of conductive barrier layers 186 may each be a Ti/TiN stack structures.

The plurality of conductive layers 188 may include doped polysilicon, a metal, a metal silicide, a conductive metal nitride, or a combination thereof. For example, the plurality of conductive layers 188 may include tungsten (W). While forming a plurality of conductive barrier layers 186 and a plurality of conductive layers 188 in the cell array region CELL, contact plugs that may be electrically connected to the peripheral circuit active region A2 may be formed in the peripheral circuit region CORE/PERI. The plurality of conductive layers 188 may be electrically insulated from each other via an insulating layer 190 filling spaces around the conductive layers 188.

In the cell array region CELL, a plurality of capacitor bottom electrodes that are electrically connectable to the plurality of conductive layers 188 may be formed on the insulating layer 190.

FIGS. 12A through 12G are cross-sectional views illustrating a method of manufacturing an integrated circuit device, according to an exemplary embodiment of the present inventive concept. Similarly to FIGS. 11A through 11P, in FIGS. 12A through 12G, some exemplary configurations of the cell array region CELL, the peripheral circuit region CORE/PERI, and the interface region INTERFACE are illustrated. A method of manufacturing an integrated circuit device that further includes a local insulation pattern 220P (see, e.g., FIG. 12G) formed around an undercut region UA2 will be described with reference to FIGS. 12A through 12G. In FIGS. 12A through 12G, reference numerals that are the same as those in FIGS. 11A through 11P denote like elements, and thus duplicative descriptions may be omitted below.

Figure 12A:
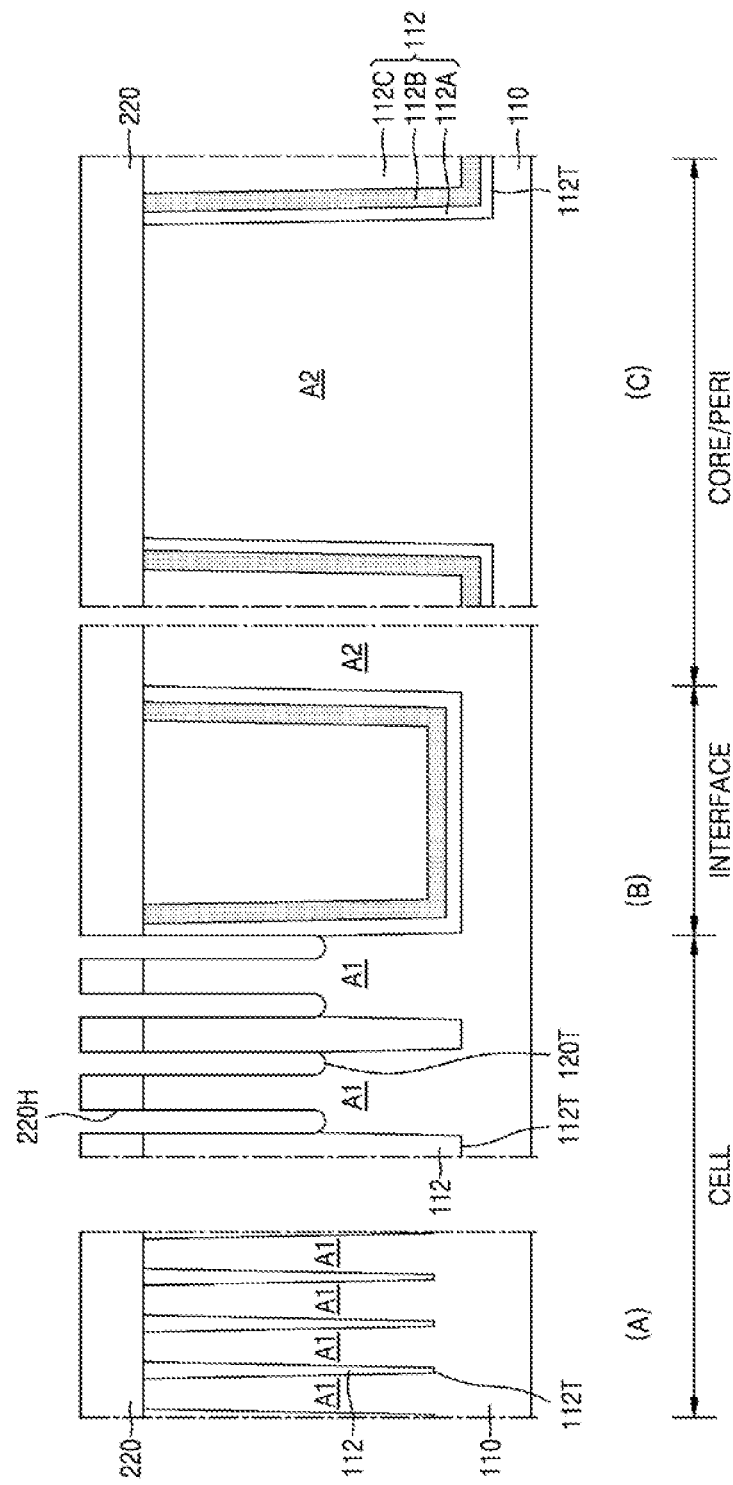
FIGS. 12A through 12G are cross-sectional views illustrating a method of manufacturing an integrated circuit device, according to an exemplary embodiment of the present inventive concept.

Referring to FIG. 12A, by using substantially the same method as described with reference to FIG. 11A, a plurality of device isolation trenches 112T may be formed in the substrate 110, and then a plurality of device isolation layers 112 filling the device isolation trenches 112T may be formed. Then, a mask insulation pattern 220 covering a plurality of cell active regions A1, a plurality of peripheral circuit active regions A2, and the plurality of device isolation layers 112 may be formed above the substrate 110. A plurality of openings 220H exposing an area where a plurality of word line trenches 120T are to be formed may be formed in the mask insulation pattern 220 in the cell array region CELL. By using the mask insulation pattern 220 as an etching mask, the substrate 110 and the device isolation layer 112 that are exposed through the plurality of openings 220H may be etched to form a plurality of word line trenches 120T. The mask insulation pattern 220 may include a silicon oxide layer, a silicon nitride layer, or a combination thereof.

Figure 12B:
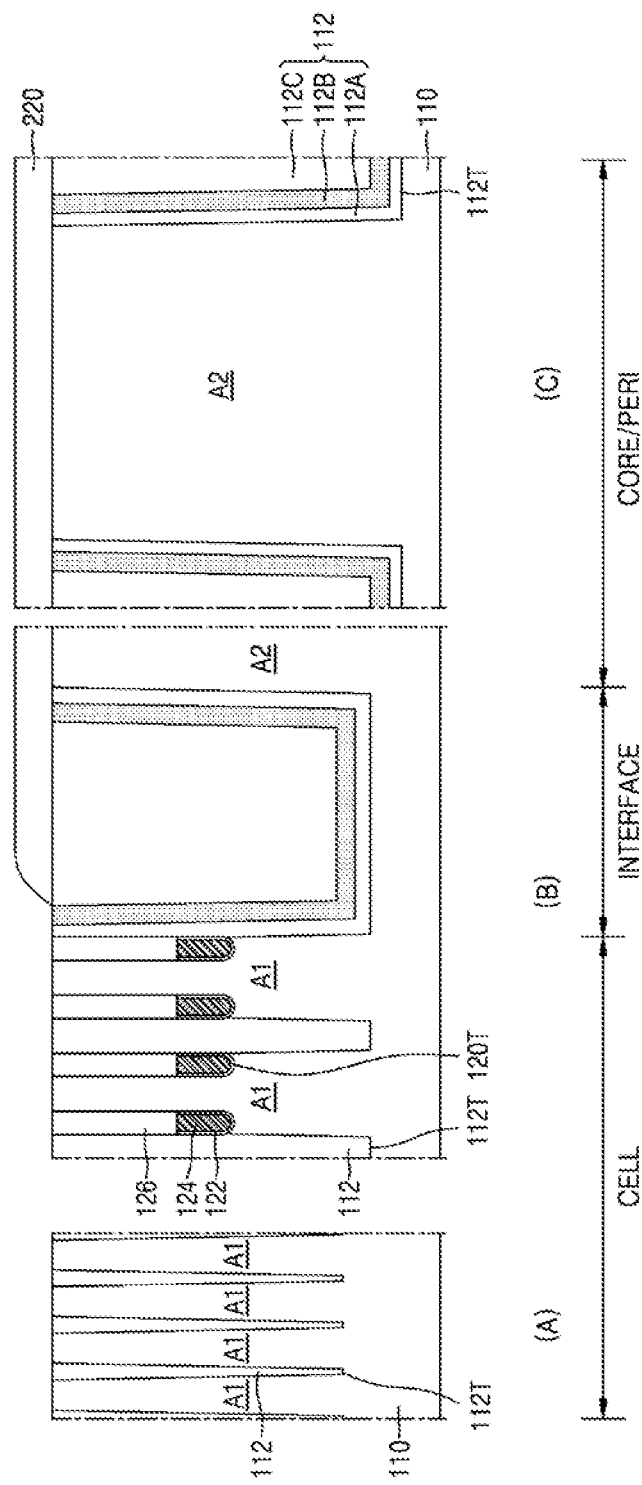

Referring to FIG. 12B, the gate dielectric layer 122, the word line 124, and the buried insulating layer 126 may be sequentially formed in each of the plurality of word line trenches 120T in the cell array region CELL, and other layers remaining on the substrate 110 may be removed. Due to the plurality of openings 220H formed in the mask insulation pattern 220, the mask insulation pattern 220 is formed of portions having a relatively small width in the cell array region CELL, and thus, while removing the other layers on the substrate 110, portions of the mask insulation pattern 220 above the substrate 110 may be removed relatively quickly due to three-dimensional etching effects. In the peripheral circuit region CORE/PERI and a portion of the interface region INTERFACE adjacent thereto, the mask insulation pattern 220 has a relatively large width unlike in the cell array region CELL, and thus, a rate of removal of the mask insulation pattern 220 may be relatively slow. Thus, when the mask insulation pattern 220 is completely removed in the cell array region CELL to expose an upper surface of the substrate 110, in the peripheral circuit region CORE/PERI and a portion of the interface region INTERFACE adjacent thereto, the mask insulation pattern 220 of a reduced thickness may remain.

Figure 12C:
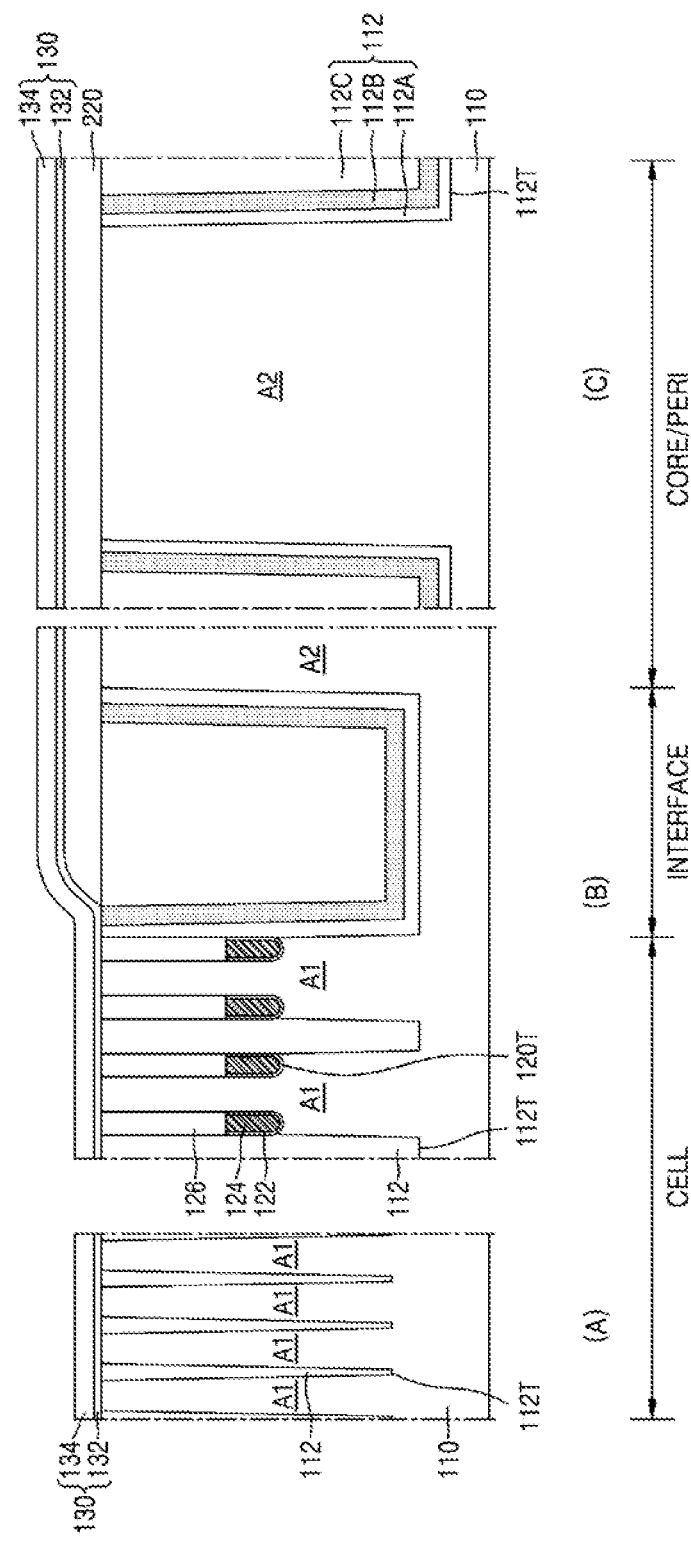

Referring to FIG. 12C, in a similar manner as described with reference to FIG. 11B, an insulating layer 130 may be formed above the substrate 110 in the cell array region CELL, the interface region INTERFACE, and the peripheral circuit region CORE/PERI. The insulating layer 130 may include a first insulating layer 132 and a second insulating layer 134. In the peripheral circuit region CORE/PERI and a portion of the interface region INTERFACE adjacent thereto, the insulating layer 130 may cover the mask insulation pattern 220.

Figure 12D:
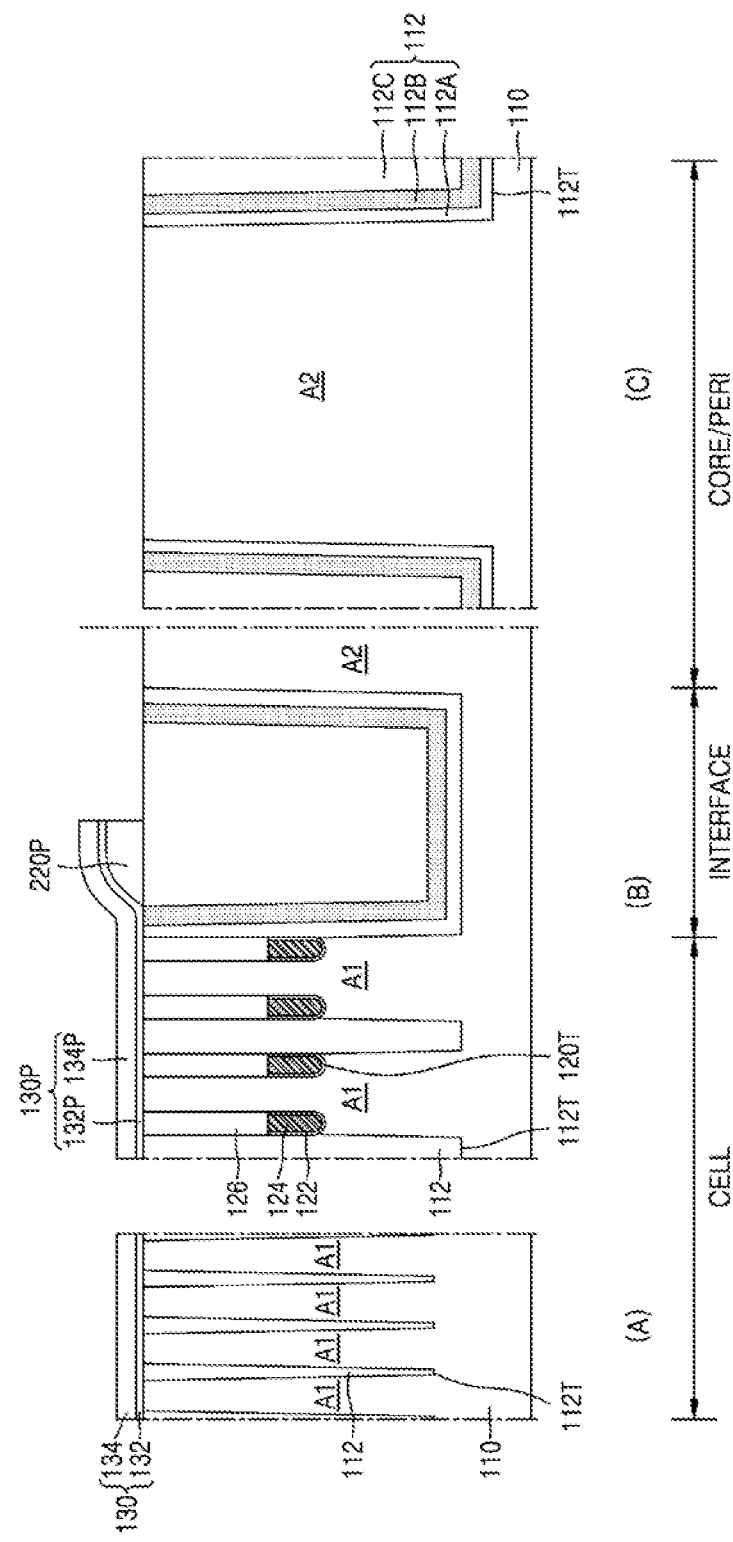

Referring to FIG. 12D, in a similar manner as described with reference to FIG. 11C, a portion of the insulating layer 130 may be removed to form the insulation pattern 130P, and a portion of the mask insulation pattern 220 exposed through the insulation pattern 130P may be removed to form a local insulation pattern 220P to expose the peripheral circuit active region A2 in the peripheral circuit region CORE/PERI.

Figure 12E:
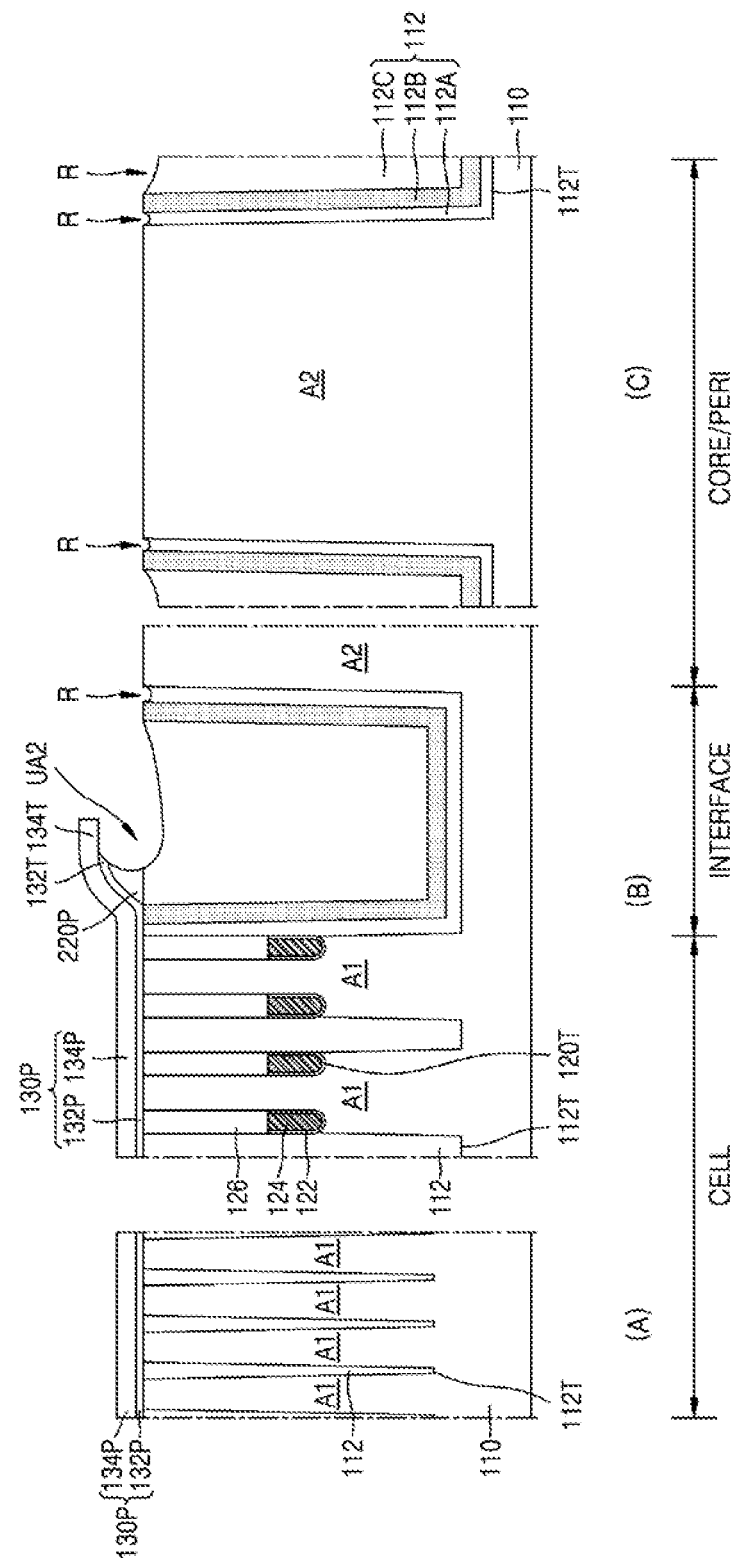

Referring to FIG. 12E, in a similar manner as described with reference to FIG. 11D, an exposed surface of the peripheral circuit active region A2 in the peripheral circuit region CORE/PERI may be cleaned to remove an undesired natural oxide layer on the peripheral circuit active region A2. While performing a cleaning operation to remove a natural oxide layer, a portion of the interface region INTERFACE and the peripheral circuit region CORE/PERI may also be exposed to the cleaning atmosphere, and thus, portions of the device isolation layer 112 in the interface region INTERFACE and the peripheral circuit region CORE/PERI that include an oxide may be partially consumed by the cleaning atmosphere, such that a recess R is formed in each upper portion of the first insulation liner 112A and the buried insulating layer 112C in the peripheral circuit region CORE/PERI. In addition, a portion of the buried insulating layer 112C forming the device isolation layer 112 under the terminal portion 134T of the second insulation pattern 134P in the interface region INTERFACE, a portion of the local insulation pattern 220P, and a portion of the first insulation pattern 132P may be consumed by the cleaning atmosphere so as to form the undercut region UA2 under the terminal portion 134T of the second insulation pattern 134P.

Figure 12F:
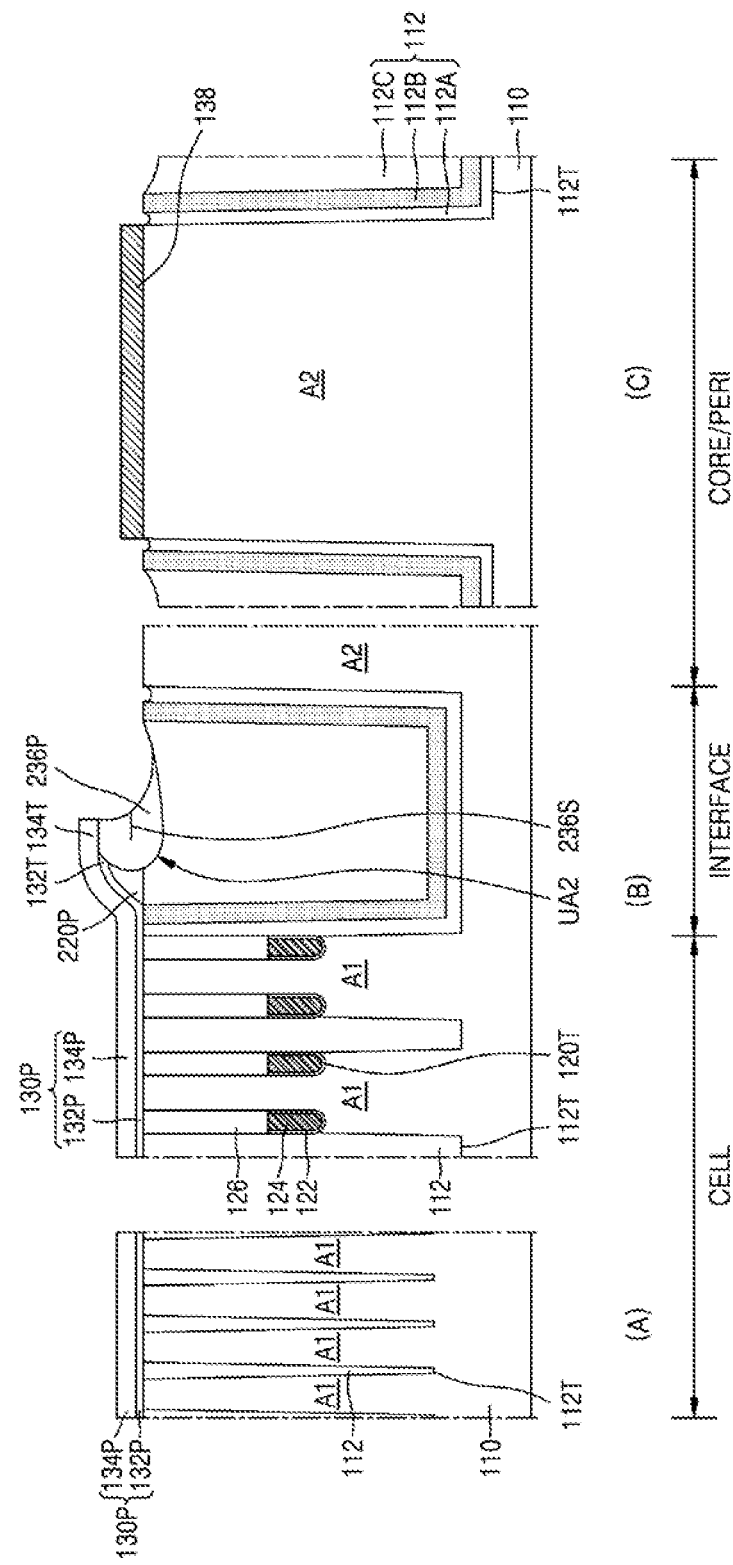

Referring to FIG. 12F, in a similar manner as described with reference to FIGS. 11E through 11G, the buried mask layer 136 (see, e.g., FIG. 11E) may be formed on the substrate 110, and, by using a selective epitaxial growth process, the semiconductor layer 138 may be formed from a surface of the peripheral circuit active region A2 that is exposed through the hole 136H of the buried mask layer 136. Then, the buried mask layer 136 may be isotropically etched by leaving only a portion of the buried mask layer 136 that fills the undercut region UA2. The portion of the buried mask layer 136 filling the undercut region UA2 may be left as a buried pattern 236P.

The buried pattern 236P may be extended along a periphery of the cell array region CELL such that the buried pattern 236P has a closed loop shape surrounding the cell array region CELL (e.g., when viewed in a plan view). In an exemplary embodiment of the present inventive concept, a seam portion 236S may be left in the buried pattern 236P. In an exemplary embodiment of the present inventive concept, the seam portion 236S need not be left in the buried pattern 236P. In an exemplary embodiment of the present inventive concept, an air gap having a similar shape as the air gap AG1 described with reference to FIG. 4 or the air gap AG2 described with reference to FIG. 7 may be left in a portion of the buried pattern 236P that is adjacent to the seam portion 236S. Similarly to the buried pattern 136P illustrated in FIG. 11G, the buried pattern 236P may include the convex surface CVX facing the cell array region CELL and a concave surface CCV facing the peripheral circuit region CORE/PERI.

In the interface region INTERFACE, as the undercut region UA2 formed between the device isolation layer 112 and the second insulation pattern 134P is filled with the buried pattern 236P, while a subsequent process is being performed, undesired contamination sources, particularly, impurities such as metal particles, may be prevented from penetrating into or remaining in the undercut region UA2.

Figure 12G:
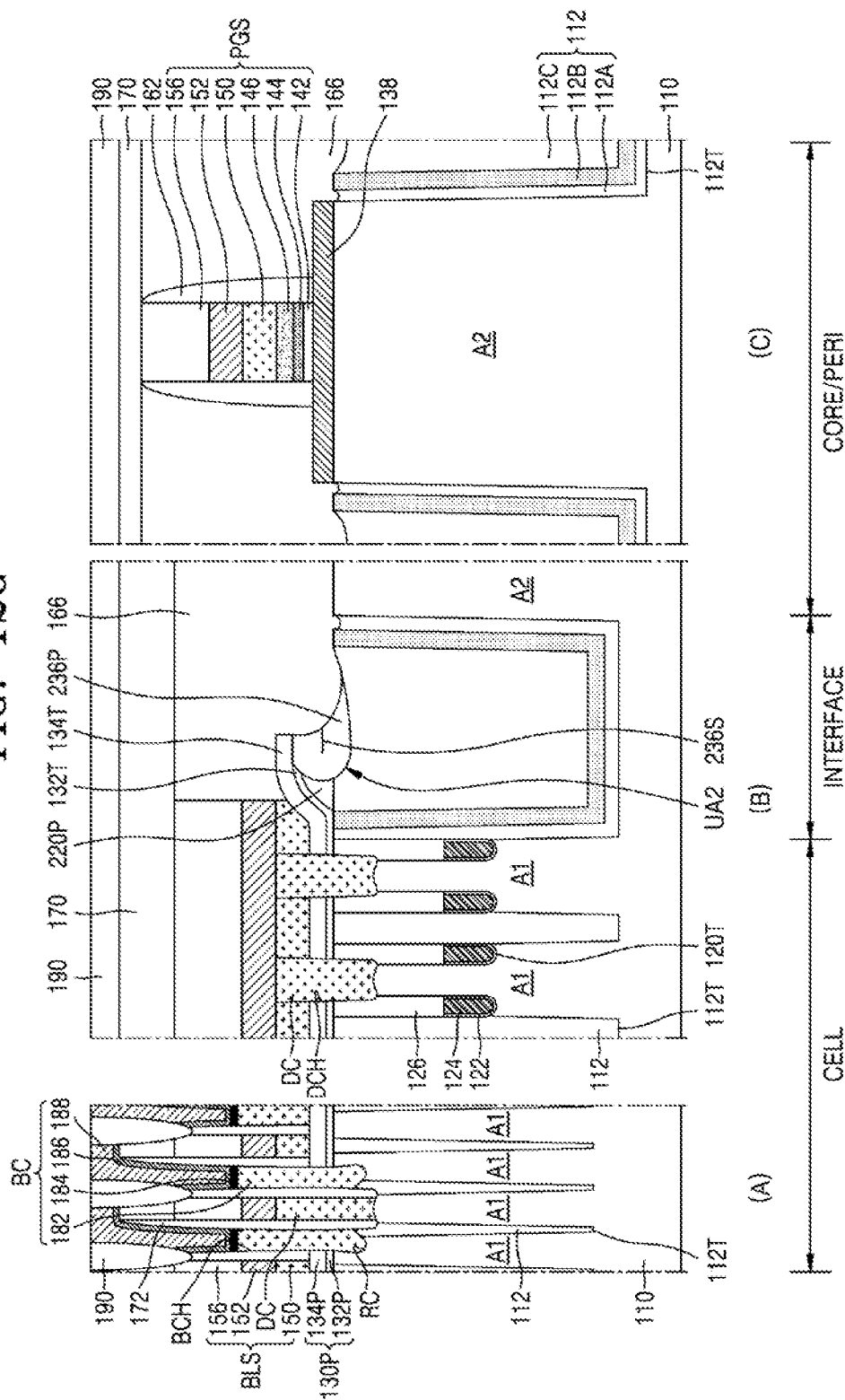

Referring to FIG. 12G, the processes described with reference to FIGS. 11H through 11P may be performed on a resultant product of the embodiment of FIG. 12F to form a plurality of bit line structures BLS and a plurality of direct contacts DC in the cell array region CELL, and a peripheral gate structure PUS in the peripheral circuit region CORE/PERI.

While the present inventive concept has been particularly shown and described with reference to exemplary embodiments thereof, it will be understood that various changes in form and details may be made therein without departing from the spirit and scope of the present inventive concept.

What is claimed is:

1. An integrated circuit device comprising:
a substrate having a first region and a second region separated from each other along a direction parallel to an upper surface of the substrate;
an interface device isolation layer that fills an interface trench in an interface region between the first region and the second region and defines a portion of a first active area positioned in the first region and a portion of a second active area positioned in the second region;
an insulation pattern extending from the first region to an upper portion of the interface device isolation layer, wherein the insulation pattern covers the first active area and at least a portion of the interface device isolation layer, and wherein the insulation pattern defines an undercut area on an upper surface of the interface device isolation layer; and
a buried pattern and a local insulation pattern substantially filling the undercut region,
wherein the insulation pattern includes a planar top surface overlying the first active area and a convex top surface overlying the buried pattern, the convex top surface being farther from the substrate than the planar top surface, and
wherein the local insulation pattern is in contact with a convex surface of the buried pattern.

2. The integrated circuit device of claim 1, wherein the convex surface of the buried pattern protrudes toward the first region and a concave surface of the buried pattern faces the second region along the direction parallel to the upper surface of the substrate.

3. The integrated circuit device of claim 1, wherein the insulation pattern comprises a first insulation pattern and a second insulation pattern that are sequentially stacked on the substrate and include different materials from each other, wherein the buried pattern includes a same material as that of one of the first insulation pattern and the second insulation pattern.

4. The integrated circuit device of claim 1, wherein the insulation pattern comprises:
a first insulation pattern extending from the first region toward the second region to a first location at a first horizontal distance from the first region along the direction parallel to the upper surface of the substrate; and
a second insulation pattern covering an upper surface of the first insulation pattern and substantially covering an upper surface of the buried pattern, wherein the second insulation pattern extends from the first region toward the second region to a second location at a second horizontal distance from the first region that is greater than the first horizontal distance.

5. The integrated circuit device of claim 1, wherein the buried pattern does not include a metal.

6. The integrated circuit device of claim 1, wherein the interface device isolation layer surrounds the first region when viewed in a plan view, and wherein the buried pattern disposed on the interface device isolation layer has a closed loop shape.

7. The integrated circuit device of claim 1, wherein the buried pattern comprises a seam line extending toward an inner portion of the buried pattern from a surface of the buried pattern facing the second region.

8. The integrated circuit device of claim 1, wherein the buried pattern comprises a seam line extending toward an inner portion of the buried pattern from a surface of the buried pattern facing the second region, and an air gap formed at an end of the seam line.

9. The integrated circuit device of claim 1, wherein the local insulation pattern is positioned in the interface region, wherein the local insulation pattern is surrounded by a combination of the interface device isolation layer, the insulation pattern, and the buried pattern, and wherein the local insulation pattern defines a portion of the undercut area.

10. The integrated circuit device of claim 1, wherein the insulation pattern has a curved cross-sectional shape in the interface region.

11. An integrated circuit device comprising:
a substrate comprising a cell array region including a cell active region and a peripheral circuit region including a peripheral circuit active region separated from each other along a direction parallel to an upper surface of the substrate;
a first device isolation layer filling an interface trench extending in an interface region between the cell array region and the peripheral circuit region and defining a portion of the cell active region and a portion of the peripheral circuit active region;

an insulation pattern extending from the cell array region to an upper portion of the first device isolation layer, wherein the insulation pattern covers an upper surface of the cell active region and at least a portion of the first device isolation layer, and wherein the insulation pattern defines an undercut area on an upper surface of the first device isolation layer; and a buried pattern substantially filling the undercut region, wherein the buried pattern comprises a seam line extending from a surface of the buried pattern toward an inner portion of the buried pattern, and an air gap formed at an end of the seam line.

12. The integrated circuit device of claim 11, wherein an interface between the first device isolation layer and the buried pattern has a curved surface.

13. The integrated circuit device of claim 11, wherein the buried pattern comprises a convex surface facing the cell array region and a concave surface facing the peripheral circuit region along the direction parallel to the upper surface of the substrate.

14. The integrated circuit device of claim 1, wherein the insulation pattern comprises:

a first insulation pattern extending from the cell array region toward the peripheral circuit region to a first location at a first horizontal distance from the cell array region along the direction parallel to the upper surface of the substrate; and a second insulation pattern covering an upper surface of the first insulation pattern and substantially covering an upper surface of the buried pattern, wherein the second insulation pattern extends from the cell array region to a second location of the interface region that is closer to the peripheral circuit region than the first location.

15. The integrated circuit device of claim 11, further comprising:

a plurality of word lines in the substrate in the cell array region;

a plurality of bit lines extending on the second insulation pattern in the cell array region;

a compound semiconductor layer positioned in the peripheral circuit active region; and a gate stack structure disposed on the compound semiconductor layer.

16. The integrated circuit device of claim 11, wherein the buried pattern does not include a metal.

17. The integrated circuit device of claim 11, wherein the first device isolation layer surrounds the cell array region when viewed in a plan view, and wherein the buried pattern disposed on the first device isolation layer has a closed loop shape.

18. The integrated circuit device of claim 11, further comprising a second device isolation layer defining another portion of the cell active region in the cell array region, wherein a width of the second device isolation layer is smaller than a width of the first device isolation layer.

19. The integrated circuit device of claim 11, wherein the buried pattern comprises a seam line extending from a surface of the buried pattern toward an inner portion of the buried pattern.

20. The integrated circuit device of claim 11, further comprising a local insulation pattern positioned in the interface region, wherein the local insulation pattern is surrounded by a combination of the first device isolation layer, the insulation pattern, and the buried pattern, and wherein the local insulation pattern defines a portion of the undercut region.

21. The integrated circuit device of claim 20, wherein the insulation pattern has a curved cross-sectional shape at a position adjacent to the local insulation pattern.

22. An integrated circuit device comprising:

a substrate comprising a cell array region including a cell active region and a peripheral circuit region including a peripheral circuit active region separated from each other along a direction parallel to an upper surface of the substrate;

a first device isolation layer filling an interface trench extending in an interface region between the cell array region and the peripheral circuit region and defining a portion of the cell active region and a portion of the peripheral circuit active region;

an insulation pattern extending from the cell array region to an upper portion of the first device isolation layer, wherein the insulation pattern covers an upper surface of the cell active region and at least a portion of the first device isolation layer, and wherein the insulation pattern defines an undercut area on an upper surface of the first device isolation layer; and a buried pattern substantially filling the undercut region, wherein the first device isolation layer comprises a first insulation liner, a second insulation liner, and a buried insulating layer that are sequentially stacked on an inner wall of the interface trench, and wherein the buried pattern is in direct contact with the buried insulating layer.

* * * * *